(12) United States Patent
Sugita

(10) Patent No.: US 7,508,695 B2
(45) Date of Patent: Mar. 24, 2009

(54) NONVOLATILE SEMICONDUCTOR MEMORY DEVICE AND DATA WRITING METHOD

(75) Inventor: Yasuhiro Sugita, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 78 days.

(21) Appl. No.: 11/709,202

(22) Filed: Feb. 22, 2007

(65) Prior Publication Data

US 2007/0195590 A1 Aug. 23, 2007

(30) Foreign Application Priority Data

Feb. 23, 2006 (JP) ............................. 2006-046235

(51) Int. Cl.
*G11C 11/00* (2006.01)
(52) U.S. Cl. ........................... 365/148; 365/46; 365/55; 365/97; 365/100; 365/158; 365/171; 365/173
(58) Field of Classification Search ................... 365/46, 365/55, 74, 97, 100, 131, 148, 158, 171, 365/173
See application file for complete search history.

(56) References Cited

U.S. PATENT DOCUMENTS

| 6,204,139 | B1 | 3/2001 | Liu et al. | |
|---|---|---|---|---|
| 6,788,571 | B2 * | 9/2004 | Ooishi et al. ................. | 365/171 |
| 7,297,975 | B2 * | 11/2007 | Ufert .............................. | 257/2 |
| 7,378,698 | B2 * | 5/2008 | Ha et al. ....................... | 257/295 |
| 2004/0051094 | A1 * | 3/2004 | Ooishi ............................ | 257/5 |

OTHER PUBLICATIONS

Zhuang et al., "Novell Colossal Magnetoresistive Thin Film Nonvolatile Resistance Random Access Memory (RRAM)", IEDM Technical Digest, pp. 193-196 (2000).
Baek et al., "Highly Scalable Non-volatile Resistive Memory Using Simple Binary Oxide Driven by Asymmetric Unipolar Voltage Pulses", IEDM Technical Digest, pp. 587-590 (2004).
Sakimura et al., "A 512kb Cross-point Cell MRAM", ISSCC, paper 16.1 (2003).

* cited by examiner

*Primary Examiner*—Huan Hoang
*Assistant Examiner*—Fernando N Hidalgo
(74) *Attorney, Agent, or Firm*—Nixon & Vanderhye P.C.

(57) ABSTRACT

A data writing method for writing data sequentially in a cross-point memory cell array having a variable resistive element whose electric resistance is changed by application of an electric stress is provided. When data is sequentially written in memory cells in the same row or column, the writing order of the memory cells to be written is determined according to the length from an electric connection point to a selected memory cell to be written and the increase/decrease direction of the electric resistance of each selected memory cell changed by data writing, the electric connection point being between a write voltage applying circuit, which applies a data writing voltage to a same wiring of the selected word line or bit line connected to the selected memory cell, and the same wiring, and the data writing is executed based on the determined writing order.

14 Claims, 26 Drawing Sheets

|  |  | Memory Cell Position | | | | | | | |
|---|---|---|---|---|---|---|---|---|---|
|  |  | 1 | 2 | 3 | 4 | 5 | 6 | 7 | 8 |
| Case 1 | Initial State | L | L | L | L | L | L | L | L |
|  | Writing Operation |  | P ← | | P ← | | P ← | | P |
|  | Final Data | L | H | L | H | L | H | L | H |
| Case 2 | Initial State | H | H | H | H | H | H | H | H |
|  | Writing Operation | E → | | E → | | E → | | E |  |
|  | Final Data | L | H | L | H | L | H | L | H |
| Case 3 | Initial State | H | L | H | L | H | L | H | L |
|  | Writing Operation | ↙ P ← | | P ← | | P ← | | P |  |
|  | Intermediate Data | H | H | H | H | H | H | H | H |
|  | Writing Operation | E → | | E → | | E → | | E |  |
|  | Final Data | L | H | L | H | L | H | L | H |
| Case 4 | Initial State | L | L | L | L | H | H | H | H |
|  | Writing Operation | ↙ P ← | | P ← | | | | | |
|  | Intermediate Data | L | H | L | H | H | H | H | H |
|  | Writing Operation |  |  |  | → | E → | | E |  |
|  | Final Data | L | H | L | H | L | H | L | H |

|  |  | Memory Cell Position | | | | | | | |
|---|---|---|---|---|---|---|---|---|---|
|  |  | 1 | 2 | 3 | 4 | 5 | 6 | 7 | 8 |
| Case 1 | Initial State | L | L | L | L | L | L | L | L |
|  | Writing Operation |  | P ← | | P ← | | P ← | | P |
|  | Final Data | L | H | L | H | L | H | L | H |
| Case 2 | Initial State | H | H | H | H | H | H | H | H |
|  | Writing Operation | E → | | E → | | E → | | E |  |
|  | Final Data | L | H | L | H | L | H | L | H |
| Case 3 | Initial State | H | L | H | L | H | L | H | L |
|  | Writing Operation | ← | P ← | | P ← | | P ← | | P |
|  | Intermediate Data | H | H | H | H | H | H | H | H |
|  | Writing Operation | E → | | E → | | E → | | E |  |
|  | Final Data | L | H | L | H | L | H | L | H |
| Case 4 | Initial State | L | L | L | L | H | H | H | H |
|  | Writing Operation | ← | P ← | | P ← | | | | |
|  | Intermediate Data | L | H | L | H | H | H | H | H |
|  | Writing Operation |  |  |  |  | E → | | E |  |
|  | Final Data | L | H | L | H | L | H | L | H |

Fig. 12

NONVOLATILE SEMICONDUCTOR MEMORY DEVICE AND DATA WRITING METHOD

CROSS REFERENCE TO RELATED APPLICATION

This Nonprovisional application claims priority under 35 U.S.C. §119(a) on Patent Application No. 2006-046235 filed in Japan on 23 Feb., 2006, the entire contents of which are hereby incorporated by reference.

BACKGROUND

1. Field of the Technology

The technology presented herein relates to a nonvolatile semiconductor memory device and more particularly, to a nonvolatile semiconductor memory device comprising a cross-point type memory cell array in which two-terminal structured memory cells each having a variable resistive element that can store data according to an electric resistance change by the application of an electric resistance are arranged in row and column directions, a plurality of word lines extending in a row direction and a plurality of bit lines extending in a column direction are provided, one ends of the memory cells in the same row are connected to the common word line, and the other ends of the memory cells in the same column are connected to the common bit line, and a writing method of data stored in the memory cell array.

2. Description of the Related Art

A flash memory is mainly used as the nonvolatile semiconductor memory device. Recently, problems in miniaturizing the flash memory includes a decrease in threshold voltage control due to lowering of a charge amount in a floating gate and a decrease in voltage resistance between a source and a drain due to reduction of a channel length, so that there is a limit of miniaturization of the flash memory in a plane direction.

Thus, the memory cell tends to be integrated from the plane to a laminated direction (vertical direction with respect to a substrate), and a new memory that can be laminated in the vertical direction is being developed. The new memory includes a FeRAM, a MRAM, a PRAM, a RRAM (Resistance Random Access Memory) and the like. Among these, the RRAM using a variable resistive element that can store data by electric resistance change by the application of an electric stress has been attracting attention because its memory cell can be integrated in the laminated direction.

As conventional techniques of the RRAM, there are known U.S. Patent Publication No. 6204139, W. W. Zhung et al., "Novell Colossal Magnetoresistive Thin Film Nonvolatile Resistance Random Access Memory (RRAM)", IEDM, 2002, and I. G. Baek et al., "Highly Scalable Non-volatile Resistive Memory using Simple Binary Oxide Driven by Asymmetric Unipolar Voltage Pulses", IEDM Technical Digest, pp. 587-590, December, 2004. A basic structure of the variable resistive element used in the RRAM includes a structure in which a transition metal oxide is sandwiched between an upper electrode and a lower electrode. The transition metal oxide includes $Pr_xCa_{1-x}MnO_3$, $Sm_xCa_{1-x}MnO_3$, $TiO_2$, $NiO$, $HfO_2$, $ZrO_2$ and the like.

A memory cell array structure using the RRAM includes a cross-point type memory cell array (1R type array)(refer to N. Sakimura et al., "A 512 kb Cross-point Cell MRAM", ISSCC, 16. Jan., 2003, for example). FIG. 1 is a perspective view showing the partial structure of a cross-point type memory cell array as one example, and FIG. 2 is a sectional view showing a memory cell in the memory cell array structure of the FIG. 1 in the vertical direction. In addition, electric insulators provided between the memory cells are not shown in the drawings.

According to the cross-point memory cell array, memory cells M are arranged at crossed points between a plurality of parallel bit lines BL and a plurality of parallel word lines WL that are orthogonal to the bit lines BL. The memory cell M comprises a variable resistive element 21. According to the cross-point memory cell array, since it is not necessary to form a switching element such as a transistor in each memory cell M, the memory cell array structure in which the plurality of memory cell arrays are laminated vertically can be easily provided. Thus, when the memory cells M are laminated by N layers, the area of the memory cell array can be $4F^2/N$ (F: minimum processing line width and N: the number of layers). As a result, the nonvolatile memory device in which the area of the memory cell array is small can be implemented.

Here, the reading and writing operations of the cross-point memory cell array will be described. FIGS. 3 to 5 are schematic views showing the cross-point memory cell array structure. As shown in the drawings, a plurality of word lines WL0 to WLn extend in the vertical direction and a plurality of bit lines BL0 to BLn extend in the lateral direction. A memory cell is positioned at each cross-point between the word lines WL0 to WLn and the bit lines BL0 to BLn. In FIGS. 3 to 5, a variable resistive element at the cross-point between each word line and each bit line is not shown. In addition, to shift the resistance of the variable resistive element of the memory cell from low resistance to high resistance is defined as "program" while to shift the resistance of the variable resistive element of the memory cell from high resistance to low resistance is defined as "erase". Thus, writing operation for the data of the memory cell includes a programming operation and an erasing operation.

First, a reading operation will be described. When information is read out from the memory cell selected as an object to be read out, as shown in FIG. 3, a readout voltage (+Vr) is applied to all the word lines, the readout voltage (+Vr) is applied to unselected bit lines that are not connected to the selected memory cell, and the selected bit line connected to the selected memory cell is set at 0V. Then, it is determined whether the variable resistive element of each memory cell on the selected bit line is in a high resistance state or a low resistance state by detecting whether a current flows in each word line or not.

Next, the programming operation will be described. When data is to be programmed in the memory cell selected as an object to be programmed, as shown in FIG. 4, a program voltage (+Vpp) is applied to the selected word line connected to the selected memory cell, a middle voltage (+Vpp/2) is applied to the unselected word lines that are not connected to the selected memory cell, and the middle voltage (+Vpp/2) is applied to the unselected bit lines that are not connected to the selected memory cell, and the selected bit line connected to the selected memory cell is set at the ground voltage (0V). Thus, the program voltage +Vpp is applied to the selected memory cell. Meanwhile, the middle voltage +Vpp/2 is applied to unselected memory cells A existing on the selected word line and unselected memory cells B existing on the selected bit line. In general, the program voltage Vpp is set so that data is not programmed in the memory cell at the middle voltage.

Next, the erasing operation will be described. When data is to be erased from the memory cell selected as an object to be erased, as shown in FIG. 5, an erase voltage (+Vpp) is applied to the selected bit line connected to the selected memory cell, the middle voltage (+Vpp/2) is applied to the unselected word lines that are not connected to the selected memory cell, the middle voltage (+Vpp/2) is applied to the unselected bit lines that are not connected to the selected memory cell, and the selected word line connected to the selected memory cell is set at the ground voltage (0V). Thus, the erase voltage −Vpp is applied to the selected memory cell. Meanwhile, the middle voltage −Vpp/2 is applied to the unselected memory cells A existing on the selected word line and the unselected memory cells B existing on the selected bit line. In general, the erase voltage Vpp is set so that data is not erased in the memory cell at the middle voltage having negative polarity.

In the programming and erasing operations, voltages applied to the selected word line, the unselected word line, the selected bit line and the unselected bit line are supplied from a word line decoder connected to each word line to perform a selecting or unselecting operation for the word line and a bit line decoder connected to each bit line to perform a selecting or unselecting operation for the bit line. In general, the word line and the word line decoder are electrically connected at the end of each word line, and similarly, the bit line and the bit line decoder are electrically connected at the end of each bit line. Therefore, at the time of programming operation, a program current flowing in the selected memory cell connected to the selected word line and the selected bit line is supplied from one of the word line decoder and the bit line decoder, to the other of the word line decoder and the bit line decoder through the selected word line, the selected bit line and the selected memory cell.

By the way, according to the cross-point memory cell array structure, when the word lines and the bit lines are arranged with minimum processing line widths and intervals, the memory cell area can be minimized. Meanwhile, the arrangement interval (distance between centers) of contact holes (through holes provided in an interlayer insulation film between two different wiring layers) used in electrically connecting each word line to the word line decoder and in electrically connecting each bit line to the bit line decoder is larger than the wiring interval (distance between center lines) of the word line and the bit line. This is because a contact pad of the wiring layer connected by the contact hole has to be larger than the diameter (minimum processing dimension) of the contact hole in order to ensure the alignment margin between the contact pad and the contact hole. Therefore, it is difficult to arrange the contact hole at the same wiring interval as that of the word line and the bit line arranged with the minimum processing line widths and intervals.

Since the interval of the contact hole is larger than the interval of the word line and the bit line, as shown in FIG. 6, when a contact C (a contact hole CH and a contact pad CP) to be arranged at the end of the word line to be electrically connected to the word line decoder is arranged each end so as to sandwich the memory cell array in such a manner that the contacts C are arranged at the right ends of the even-numbered word lines WL0, WL2, WL4, . . . and they are arranged at the left ends of the odd-numbered word lines WL1, WL3, WL5, . . . , the memory cell area of the cross-point memory cell array can be minimized and the contact can be effectively laid out.

Here, as shown in FIG. 6, when data is sequentially programmed in the memory cell array in which the contact is arranged at the end of the word line, each memory cell for programming is accessed in the order as shown in FIG. 7 in general before.

First, the word line WL0 designated by the lowest-order row address is selected and then the bit line BL0 designated by the lowest-order column address is selected to program data in the memory cell M00 connected to the word line WL0 and the bit line BL0. Continuously, while the same word line WL0 is selected, the column address is increased to select the bit lines BL1 to BLn sequentially to sequentially program data in memory cells M01, M02, . . . , M0n. After data have been programmed in all the memory cells connected to the word line WL0, the row address is increased by one to select the word line WL1 and the column address is returned to the lowest-order column address to select the bit line BL0 to program data in the memory cell M10 connected to the word line WL1 and the bit line BL0, and similarly while the same word line WL1 is selected, the column address is increased to sequentially select the bit lines BL1 to BLn to sequentially program data in memory cells M11, M12, . . . . M1n. After data has been programmed in all memory cells connected to the word line WL1, similarly, the row address is increased one by one to sequentially program data in memory cells connected to the word lines WL2 to WLn.

According to the case where data is sequentially written along the word lines, as for the even-numbered word lines WL0, WL2, WL4, . . . , data is sequentially written from the memory cell further from the contact C, that is, the memory cell further from the supply source of the word line voltage toward the contact, while as for the odd-numbered word lines WL1, WL3, WL5, . . . , data is sequentially programmed from the memory cell closer to the contact C, that is, the memory cell closer to the supply source of the word line voltage toward the side opposite to the contact.

FIG. 8 shows the relation between a programming time and a program current in the variable resistive element of a single memory cell. According to FIG. 8, it has been found that the programming time in the variable resistive element depends on the program current and it becomes considerably long as the program current is reduced.

The program current of the single memory cell is determined by a net program voltage applied to both ends of the single memory cell and the resistance value of the variable resistive element, so that the voltage (net program voltage) of the single memory cell is found by subtracting a voltage drop from a first connection point of the selected word line to the selected memory cell and a voltage drop from a second connection point of the selected bit line to the selected memory cell, from the program voltage applied between the first connection point between the selected word line and the word line decoder and the second connection point between the selected bit line and the bit line decoder. In addition, the voltage drop of the selected word line is determined by the wiring resistance of the selected word line, and a leak current flowing through the unselected memory cell positioned between the first connection point connected to the selected word line and the selected memory cell. Similarly, the voltage drop of the selected bit line is determined by the wiring resistance of the selected bit line, and a leak current flowing through the unselected memory cell positioned between the second connection point connected to the selected bit line and the selected memory cell.

FIG. 9 shows a case where the resistance values of the memory cells connected to the word line WL0 are all in a low resistance state $R_L$, and programming is sequentially performed in the memory cells of that row so that the resistance value becomes high resistance state $R_H$. When the programming is performed from the memory cell M00 at the left end that is furthest away from the contact to the right direction, since the resistance values of the other unselected memory cells M01 to M0n are all in the low resistance state $R_L$ before programming, at the time of programming in the memory cell M00, the leak current flowing in the selected word line is a maximum, and since the wiring resistance between the selected memory cell M0 and the contact is high, the voltage drop of the selected word line is a maximum, so that the net program voltage applied to the selected memory cell M00 is considerably lowered and the program current flowing in the selected memory cell M00 is reduced and its programming time is elongated. Meanwhile, at the time of programming of the memory cell M0$n$ at the right end that is closest to the contact, since the resistance values of the other unselected memory cells M00 to M0$n$-1 are all in the high resistance state $R_H$ after programming, the leak current flowing in the word line is a minimum and since the wiring resistance between the selected memory cell M0$n$ and the contact is low, the voltage drop of the selected word line is a minimum and the net program voltage applied to the selected memory cell M0$n$ is not lowered so much, so that the program current flowing in the selected memory cell M0$n$ is prevented from being reduced and the programming time is short. That is, when data is programmed from the memory cell furthest from the contact, the first memory cell is in the worst state in both leak current and wiring resistance, and the last memory cell is in the best state in both leak current and wiring resistance, so that there are large variations in the programming time.

Therefore, when a large amount of data is programmed, the total programming time is elongated because of the variations in the programming time. In addition, the variations in the programming time make it difficult to control the resistance value after the programming. Furthermore, when the program current is set based on the memory cell that is slow in the programming time, the program current is excessive for the memory cell that is fast in the programming time, which could reduce the reliability of the memory cell.

SUMMARY

The example embodiment present herein was made in view of the above problems and it is a feature of the example embodiment to provide a data writing method in a nonvolatile semiconductor memory device comprising a cross-point memory cell array having a variable resistive element whose electric resistance is changed by the application of an electric stress, in which deterioration in programming and erasing speed is improved, control of the resistance value of the variable resistive element after the programming and erasing operations is simplified, and high reliability can be implemented when data is sequentially written in the memory cell array, and to provide the nonvolatile semiconductor memory device.

According to a method of writing data of the example embodiment to attain the above feature, data is stored in a memory cell array, in which two-terminal structured memory cells each having a variable resistive element capable of storing data according to an electric resistance change by application of an electric stress are arranged in a row and column direction, a plurality of word lines extending in the row direction and a plurality of bit lines extending in the column direction are provided, the memory cells on the same row are connected at one end to the common word line, and the memory cells on the same column are connected at the other end to the common bit line, and it is characterized in that the method comprises writing data sequentially in a plurality of memory cells on the same row or the same column in the memory cell array based on a writing order of the plurality of memory cells to be written determined according to a memory cell wiring length and an increase/decrease direction of an electric resistance of each memory cell changed by the writing data, wherein the memory cell wiring length is defined by length of a same wiring of a selected word line or a selected bit line which is connected to the memory cell to be written from an electric connection point between a write voltage applying circuit and the same wiring to the memory cell to be written, and the write voltage applying circuit applies a voltage for writing data to the selected word line or the selected bit line, as first characteristics.

According to the data writing method of the first characteristics, when data is sequentially written in the memory cells in the same row or the same column in the memory cell array, unlike the conventional case where the word line and the bit line are simply changed based on the ascending or descending order of the row address or the column address, since the writing order is determined based on the memory cell wiring length of the memory cell to be written and the increase/decrease direction of the electric resistance, the writing order can be determined such that the leak current of the word line or bit line connected to the memory cell to be written determined depending on the resistance state of the unselected memory cell on the same word line or bit line, and the wiring resistance determined by the memory cell wiring length are made to have the relation such that when one significantly contributes to the voltage drop on the word line or the bit line, the other does not contribute to it. Thus, the variations in the voltage drop can be prevented by the position of the memory cell on the word line or the bit line, and it is prevented that the program current or the erase current flowing in the memory cell to be written is reduced and the programming or the erasing time becomes extremely slow.

The data writing method according to the first characteristics is further characterized in that the writing order of the plurality of memory cells to be written which are the same in the increase/decrease direction of the electric resistance is determined such that the longer the memory cell wiring length of one memory cell to be written is, the larger the number of memory cells in a high resistance state in all other memory cells than the one memory cell to be written on the same wiring is, as second characteristics.

According to the above data writing method of the second characteristics, since the variation in the voltage drop depending on the position of the memory cell on the word line or the bit line can be prevented in any two memory cells having the same increase/decrease direction of the electric resistance but different in the writing order, the variation in the voltage drop in the plurality of memory cells to be written can be similarly prevented, so that it is prevented that the program current or the erase current flowing in the memory cell to be written is reduced and the programming or the erasing time becomes extremely slow.

The data writing method according to the above first or second characteristics is further characterized in that a plurality of connection points exists on the same wiring, and the writing order of the plurality of memory cells to be written is determined using the shortest one of lengths from the plurality of the connection points to the memory cell to be written as the memory cell wiring length, as third characteristics.

According to the data writing method of the third characteristics, when the plurality of connection points are provided on the one word line or bit line, for example, when the connection points are provided at both ends of each word line or bit line, the effect of the data writing method of the first characteristics can be provided.

Any of the above data writing method is further characterized in that the writing data is performed in a first memory cell group whose electric resistance is increased earlier than a second memory cell group whose electric resistance is decreased when the memory cell whose electric resistance is increased and the memory cell whose electric resistance is decreased by the writing data are mixed in the plurality of memory cells to be written, as fourth characteristics.

According to the data writing method of the fourth characteristics, although the number of the memory cells whose resistance value is in the high resistance state and the number of the memory cells whose resistance value is in the low resistance state connected to the same word line or bit line could be changed by the data writing, when the writing is performed in the first memory cell group first, since the number of the memory cells in the high resistance state is increased and the number of memory cells in the low resistance state is decreased in the sequential writing operations for the first memory cell group, the leak current flowing through the unselected memory cell is sequentially reduced, and the number of memory cells in the low resistance state is increased and the number of memory cells in the high resistance state is decreased in the sequential writing operations for the second memory cell group, so that the leak current once reduced is sequentially increased. Therefore, in the series of the writing operations since the leak current can be prevented in the reducing direction, the voltage drop on the word line or the bit line can be prevented, so that it is prevented that the program current or the erase current flowing in the memory cell to be written is reduced and the programming or the erasing time becomes extremely slow.

Any of the above data writing method is further characterized in that the writing data is sequentially performed from the memory cell of which the memory cell wiring length is shortest for a first memory cell group whose electric resistance is increased, and the writing data is sequentially performed from the memory cell of which the memory cell wiring length is longest for a second memory cell group whose electric resistance is decreased when the memory cell whose electric resistance is increased and the memory cell whose electric resistance is decreased by the writing data are mixed in the plurality of memory cells to be written, as fifth characteristics.

According to the data writing method of the fifth characteristics, since for the first memory cell group whose electric resistance is increased, the more the memory cell is influenced by the wiring resistance determined by the memory cell wiring length, the later the memory cell is to be programmed and the number of unselected memory cells whose resistance value is in the high resistance state is increased and the leak current is reduced, the influence of the wiring resistance and the decrease in the leak current are offset and the variation in the voltage drop due to the position of the memory cell on the word line or the bit line is prevented. Furthermore, since for the second memory cell group whose electric resistance is decreased, the more the memory cell is influenced by the wiring resistance determined by the memory cell wiring length, the earlier it is to be programmed and the number of unselected memory cells whose resistance value is in the low resistance state is small and the leak current is prevented from being increased, the influence of the wiring resistance and the decrease in the leak current are offset and the variation in the voltage drop due to the position of the memory cell on the word line or the bit line is prevented. Therefore, it is prevented that the program current or the erase current flowing in the memory cell to be written is reduced or increased throughout the series of writing operations, so that it is prevented that the programming or erasing time is extremely elongated.

Any of the above data writing method is further characterized in that the writing data is sequentially performed from the memory cell of which the memory cell wiring length is shortest when the electric resistances of all the plurality of memory cells to be written are increased by the writing data, as sixth characteristics.

According to the data writing method of the sixth characteristics, since the more the memory cell is influenced by the wiring resistance determined by the memory cell wiring length, the later the memory cell is to be programmed and the number of unselected memory cells whose resistance value is in the high resistance state is increased and the leak current is reduced, the influence of the wiring resistance and the decrease in the leak current are offset and the variation in the voltage drop due to the position of the memory cell on the word line or the bit line is prevented. Therefore, it is prevented that the program current or the erase current flowing in the memory cell to be written is reduced throughout the series of writing operations, so that it is prevented that the programming or erasing time is extremely elongated.

Any of the above data writing method is further characterized in that the writing data is sequentially performed from the memory cell of which the memory cell wiring length is longest when the electric resistances of all the plurality of memory cells to be written are decreased by the writing data, as seventh characteristics.

According to the data writing method of the seventh characteristics, since the more the memory cell is influenced by the wiring resistance determined by the memory cell wiring length, the earlier the memory cell is to be programmed and the number of unselected memory cells whose resistance value is in the low resistance state is small and the leak current is prevented from being increased, the influence of the wiring resistance and the increase in the leak current are offset and the variation in the voltage drop due to the position of the memory cell on the word line or the bit line is prevented. Therefore, it is prevented that the program current or the erase current flowing in the memory cell to be written is increased throughout the series of writing operations, so that it is prevented that the programming or erasing time is extremely elongated.

Any of the above data writing method is further characterized in that the method comprises comparing data of the plurality of memory cells to be written before writing with expected data after writing with respect to each memory cell, judging whether memory cells whose electric resistance is increased and memory cells whose electric resistance is decreased by the writing data are mixed in the plurality of memory cells to be written or not and classifying the plurality of memory cells to be written into a first memory cell group whose electric resistance is increased and a second memory cell group whose electric resistance is decreased, as eighth characteristics.

According to the data writing method of the eight characteristics, since the first memory cell group and the second memory cell group can be appropriately classified, the appropriate writing order can be determined for each of the first memory cell group and the second memory cell group and the effect of the data writing method according to the first characteristics can be provided.

Any of the above data writing method is further characterized in that the method comprises comparing data of the plurality of memory cells to be written before writing with expected data after writing with respect to each memory cell and judging the increase/decrease direction of the electric resistance of each memory cell changed by the writing data, as ninth characteristics.

According to the data writing method of the ninth characteristics, appropriate writing order according to the increase/decrease direction of the electric resistance of each memory can be determined by determining the increase/decrease direction of the electric resistance of each memory, so that the effect of the data writing method according to the first characteristics can be provided.

A nonvolatile semiconductor memory device according to the example embodiment to attain the above feature comprises a memory cell array in which two-terminal structured memory cells each having a variable resistive element capable of storing data according to an electric resistance change by application of an electric stress are arranged in a row and column direction, a plurality of word lines extending in the row direction and a plurality of bit lines extending in the column direction are provided, the memory cells on the same row are connected at one end to a common word line, and the memory cells on the same column are connected at the other end to a common bit line, a word line selecting circuit for selecting the predetermined number of the word lines from the plurality of word lines as selected word lines, and applying a selected word line voltage and an unselected word line voltage to the selected word lines and the unselected word lines, respectively, a bit line selecting circuit for selecting the predetermined number of the bit lines from the plurality of bit lines as selected bit lines, and applying a selected bit line voltage and an unselected bit line voltage to the selected bit lines and the unselected bit lines, respectively and a control circuit for controlling operations of the word line selecting circuit and the bit line selecting circuit, wherein the control circuit determines a writing order of the plurality of memory cells to be written using the bit line selecting circuit as the write voltage applying circuit according to a method of determining the writing order defined in the method of writing data as claimed in claim 1, and controls selection of the bit line by the bit line selecting circuit based on the determined writing order when data is sequentially written in the plurality of memory cells on the same row in the memory cell array, as first characteristics.

The nonvolatile semiconductor memory device of the first characteristics is further characterized in that the control circuit determines a writing order of the plurality of memory cells to be written using the word line selecting circuit as the write voltage applying circuit according to a method of determining the writing order defined in the method of writing data as claimed in claim 1, and controls selection of the word line by the word line selecting circuit based on the determined writing order when data is sequentially written in the plurality of memory cells on the same column in the memory cell array, as second characteristics.

According to the nonvolatile semiconductor memory device of the first or second characteristics, when data is sequentially written in the memory cells in the same row or the same column in the memory cell array, unlike the conventional case where the word line and the bit line are simply changed according to the ascending or descending order of the row address or the column address, since the control circuit determines the writing order according to the memory cell wiring length and the increase/decrease direction of the electric resistance of the memory cell to be written, the writing order can be determined such that the leak current of the word line or bit line connected to the memory cell to be written determined depending on the resistance state of the unselected memory cell on the same word line or bit line, and the wiring resistance determined by the memory cell wiring length are made to have the relation such that when one significantly contributes to the voltage drop on the word line or the bit line, the other does not contribute to it. Thus, the variations in the voltage drop can be prevented by the position of the memory cell on the word line or the bit line, and it is prevented that the program current or the erase current flowing in the memory cell to be written is reduced and the programming or the erasing time becomes extremely slow.

The nonvolatile semiconductor memory device of the first or second characteristics further comprises a buffer memory for storing an expected value data after writing the plurality of memory cells to be written, wherein the control circuit reads data before writing the plurality of memory cells to be written, compares the expected value data stored in the buffer memory with the data before writing with respect to each memory cell, and judges whether memory cells whose electric resistance is increased and memory cells whose electric resistance is decreased by the writing data are mixed in the plurality of memory cells to be written or not, as third characteristics.

According to the nonvolatile semiconductor memory device of the third characteristics, since the memory cell group in which electric resistance of the memory cells is increased by the data writing and the memory cell group in which electric resistance of the memory cells is decreased by the data writing can be appropriately classified, the appropriate writing order can be determined for each of the two memory cell groups and the effect of the nonvolatile semiconductor memory device according to the first or second characteristics can be provided.

Any of the above the nonvolatile semiconductor memory device further comprises a buffer memory for storing an expected value data after writing the plurality of memory cells to be written, wherein the control circuit reads data before writing the plurality of memory cells to be written, compares the expected value data stored in the buffer memory with the data before writing with respect to each memory cell, and judges the increase/decrease direction of the electric resistance of each memory cell changed by the writing data, as fourth characteristics.

According to the nonvolatile semiconductor device of the fourth characteristics, appropriate writing order according to the increase/decrease direction of the electric resistance of each memory can be determined by determining the increase/decrease direction of the electric resistance of each memory, so that the effect of the nonvolatile semiconductor memory device according to the first or second characteristics can be provided.

Any of the above the nonvolatile semiconductor memory is further characterized in that the variable resistive element is formed of a variable resistive material having transition metal oxide, as fifth characteristics.

The nonvolatile semiconductor memory according to any of the first to fourth characteristics is further characterized in that the variable resistive element is formed of a variable resistive material having chalcogenide, as sixth characteristics.

According to the nonvolatile semiconductor memory device of the first or second characteristics, the variable resistive element that can store data by an electric resistance change by the application of the electric stress can be concretely implemented and the effect of the nonvolatile semiconductor memory device according to the first or second characteristics can be provided.

BRIEF DESCRIPTION OF THE DRAWINGS

FIG. 12 is a view showing a data write example in a writing order determined by the data writing method according to an example embodiment;

DETAILED DESCRIPTION OF THE INVENTION

Embodiments of a data writing method (referred to as the "method of the present invention" occasionally hereinafter) and a nonvolatile semiconductor memory device (referred to as the "device of the present invention" occasionally hereinafter) will be described with reference to the drawings hereinafter.

First Embodiment

First, a description will be made of a memory cell array in which data is written according to the method of an example embodiment. The memory cell array is constituted such that nonvolatile memory cells are arranged in rows and columns and information can be electrically written in the memory cell specified by an address inputted from the outside. Furthermore, information stored in the memory cell specified by an address input can be read out.

More specifically, the memory cell array has a cross-point type memory cell array structure in which two-terminal structured memory cells each having a variable resistive element storing information by the change of electric resistance are arranged in rows and columns, a plurality of word lines extending in a row direction and a plurality of bit lines extending in a column direction are provided, one ends of the memory cells in the same row is connected to the common word line, and the other ends of the memory cells in the same column is connected to the common bit line. In addition, in this embodiment, it is assumed that the memory cell is constituted such that stored data can be written (program and erase) when an electric stress (a program voltage pulse and an erase voltage pulse) is applied to both ends of the variable resistive element and the electric resistance of the variable resistive element is changed.

Figure 1:
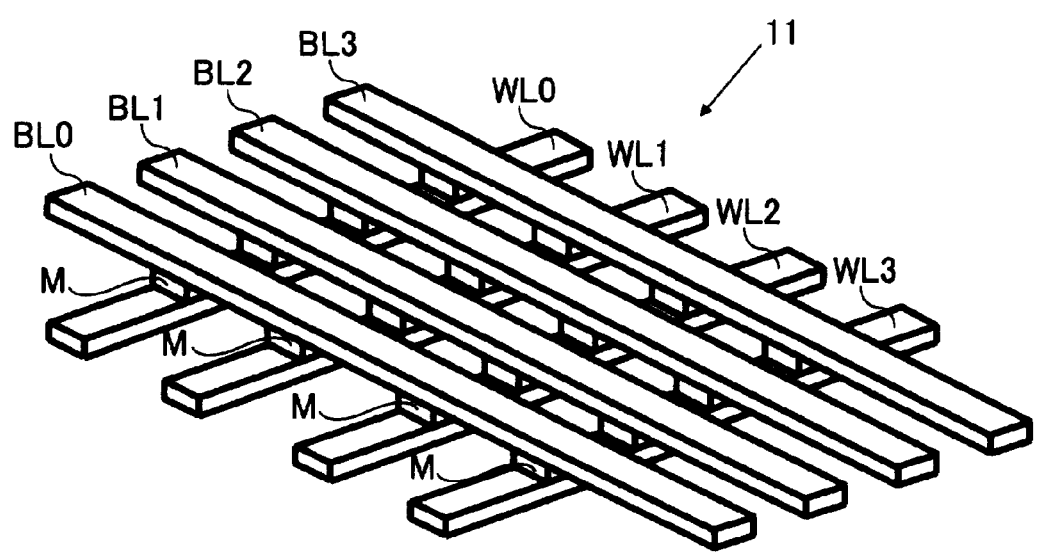
FIG. 1 is a perspective view schematically showing the partial constitution of a cross-point type memory cell array.
Figure 2:
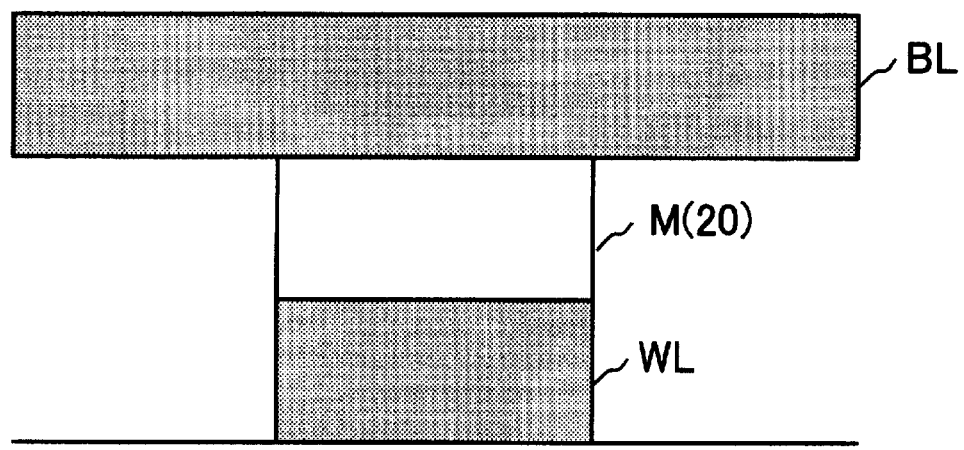
FIG. 2 is a vertical sectional view showing one example of a two-terminal structured memory cell in the cross-point type memory array shown in FIG. 1.
Figure 3:
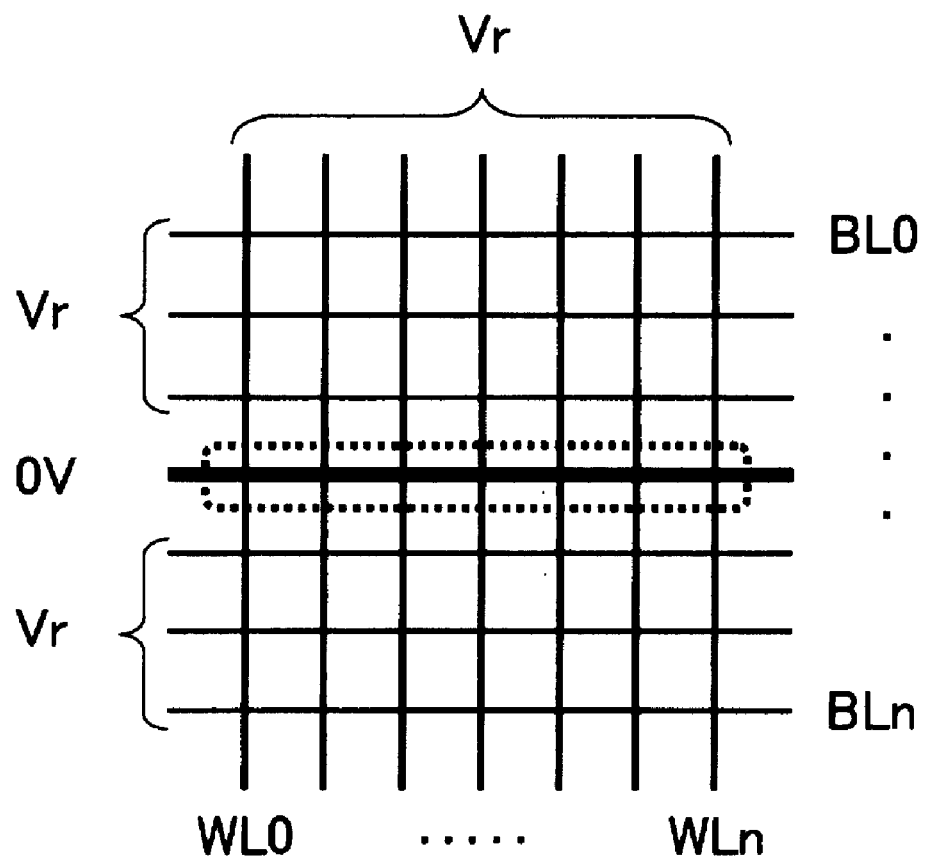
FIG. 3 is an equivalent circuit diagram showing one example of a voltage applying condition at the time of a reading operation in the cross-point type memory cell array.
Figure 4:
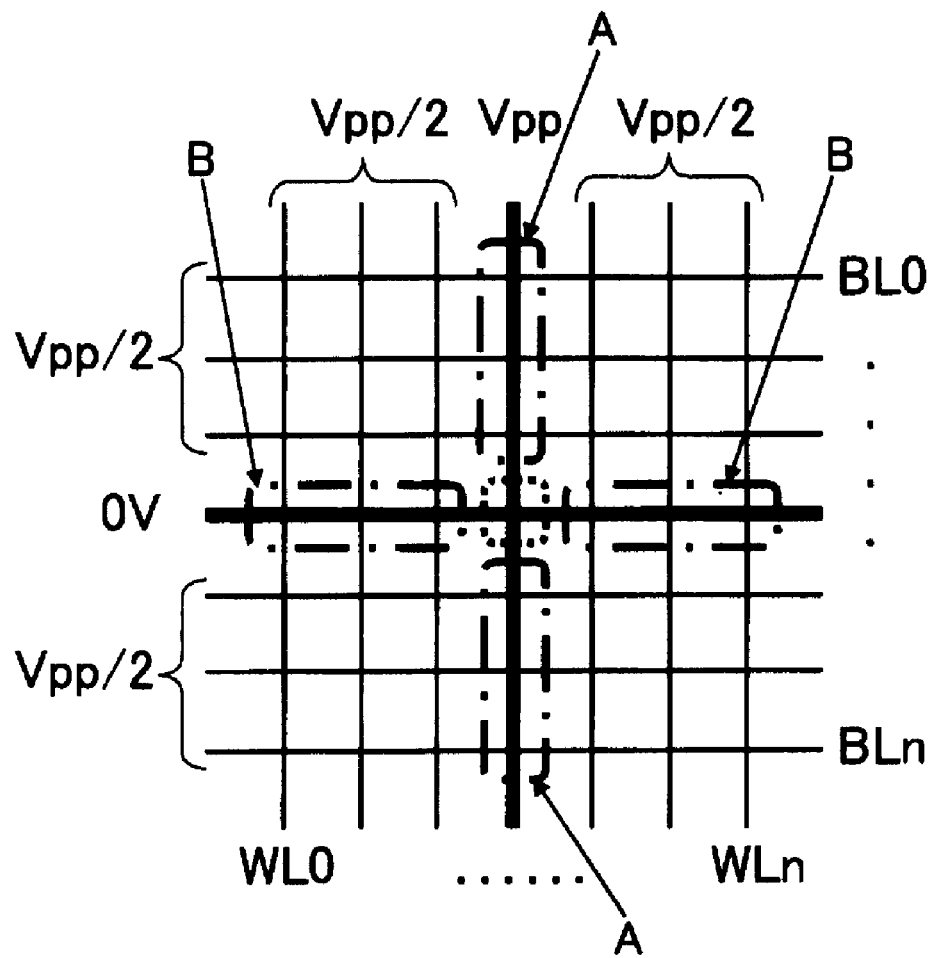
FIG. 4 is an equivalent circuit diagram showing one example of a voltage applying condition at the time of a programming operation in the cross-point type memory cell array.
Figure 5:
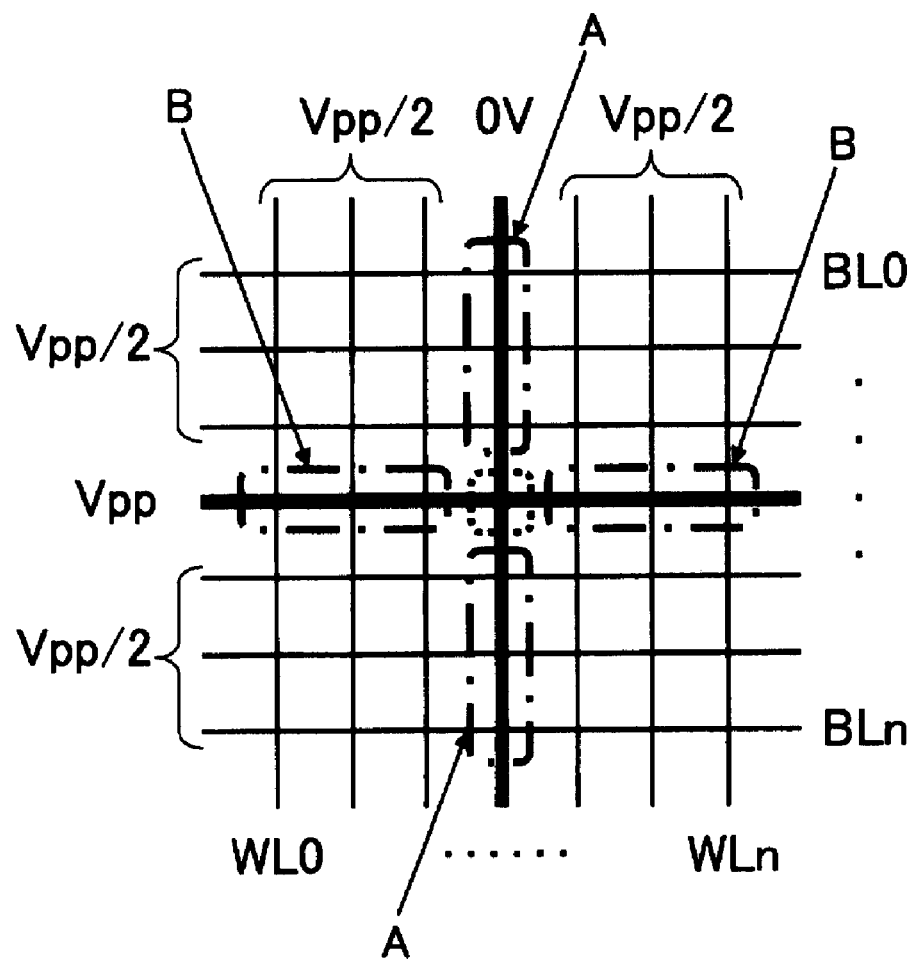
FIG. 5 is an equivalent circuit diagram showing one example of a voltage applying condition at the time of an erasing operation in the cross-point type memory cell array.

FIG. 1 is a perspective view showing the partial constitution of a cross-point type memory cell array 11 schematically. In the memory cell array 11 shown in FIG. 1, memory cells M are provided at the cross-points of four bit lines BL0 to BL3 with four word lines WL0 to WL3. FIG. 2 is a sectional view showing the memory cell taken along a line parallel to the extending direction of the bit line BL. For example, the memory cell M comprises a two-terminal variable resistive element having a variable resistor 20 formed of transition metal oxide such as PCMO, NiO and TiO, or a variable resistor 20 formed of chalcogenide (chalcogen compound) such as germanium/stibium/tellurium (GeSbTe) alloy that is changed in resistance by the electric stress. FIG. 2 shows the sectional structure of a memory cell electrode in which the bit line BL and the word line WL sandwiches the variable resistor 20, and a variable resistive element has a three-layer structure in which the variable resistor 20 is sandwiched between the two electrodes.

Although the bit line BL is provided on the upper side of the memory cell M and the word line WL is provided on the lower side thereof in the cross-point type memory cell array 11 according to the example shown in FIG. 1, the word line WL may be provided on the upper side thereof and the bit line BL may be provided on the lower side thereof as long as the bit line BL and the word line WL can select the memory cell M in different directions. Therefore, although it is assumed that write operations are sequentially performed in the memory cells connected to one word line WL in the following description, the sequential write operations may be performed to the memory cells connected to one bit line BL.

In the following description, it is assumed that the programming operation is performed when the resistance value of the memory cell is changed from a low resistance state to a high resistance state, while the erasing operation is performed when the resistance value of the memory cell is changed from the high resistance state to the low resistance state. In addition, it is assumed that a program voltage or an erase voltage to be applied to the selected word line or the selected bit line connected to the memory cell to be written is Vpp.

Figure 10:
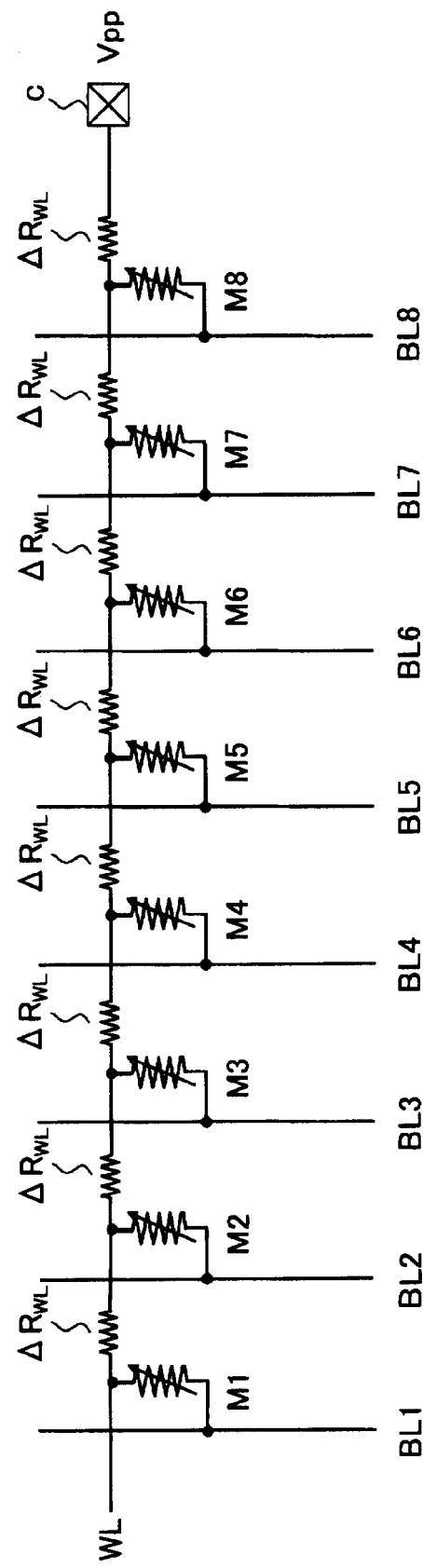
FIG. 10 is a circuit diagram schematically showing the essential part of the memory cell array to explain a data writing method according to the present invention.

A description will be made of a basic thought of the method of the present invention. FIG. 10 shows a memory cell group connected to one word line WL to be written. In this example, eight memory cells M1 to M8 are connected to the selected word line WL. Section wiring resistances ARWL exist between the memory cells in the selected word line WL so as to be constantly distributed. In addition, a contact C that is a starting point when the program voltage Vpp is applied to the selected word line WL is provided at the right end of the selected word line WL. Here, the contact C is the electric connection point between a write voltage applying circuit from which the program voltage Vpp is applied to the selected word line WL and the selected word line WL, so that it is not necessary to connect the write voltage applying circuit to the selected word line WL directly as long as the contact C is the electric connection point. For example, the selected word line WL may be connected to a wiring formed of a low resistance material and extending from the write voltage applying circuit through the contact C.

Figure 11A:
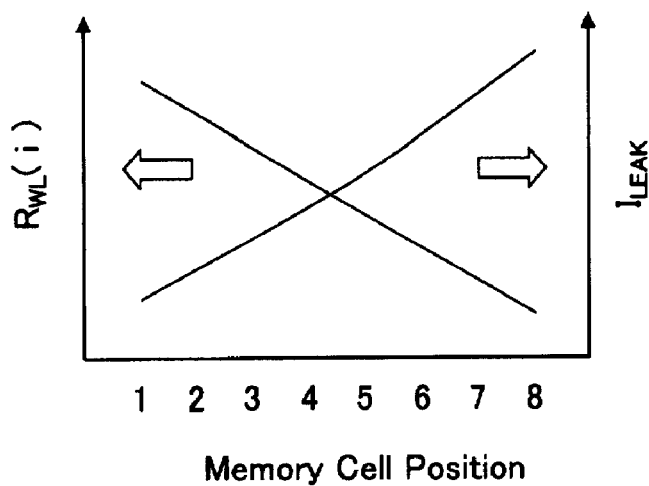
FIG. 11 is a view to explain the data writing method according to an example embodiment.

Here, FIG. 11A shows the relation between the memory cell position (i) of each memory cell Mi (i=1 to 8) and a wiring resistance $R_{WL}$(i) between each memory cell position of the selected word line WL and the contact C. In addition, each wiring resistance $R_{WL}$(i) is found by multiplying a wiring length (corresponding to a memory cell wiring length) between each memory cell position and the contact C, with a wiring resistance per unit of wiring length, that is, it is expressed by the total of the section wiring resistances $\Delta R_{WL}$ distributed between the memory cell position and the contact C. As shown in FIG. 11A, the wiring resistance $R_{WL}$(8) of the memory cell M8 that is the closest to the contact C is a minimum, and the wiring resistance $R_{WL}$(1) of the memory cell M1 that is the farthest from the contact C is a maximum.

Here, at the time of programming in the memory cell M1 having the maximum wiring resistance, when the total of leak currents $I_{LEAK}$ to the unselected memory cell is large, the voltage drop between the memory cell M1 and the contact C becomes high, so that the net program voltage applied to the memory cell M1 is lowered and a write current flowing in the memory cell M1 is small and its programming time is elongated.

Thus, as shown in FIG. 11A, the writing time is prevented from being elongated by implementing the relation in which the memory cell Mi having higher wiring resistance $R_{WL}$(i) has the smaller leak current total $I_{LEAK}$ to the unselected memory cell at the time of writing operation of each memory cell, that is, by implementing the relation in which the leak current $I_{LEAK}$ is minimum in the memory cell M1 and the leak current $I_{LEAK}$ is maximum in the memory cell M8.

Figure 11B:
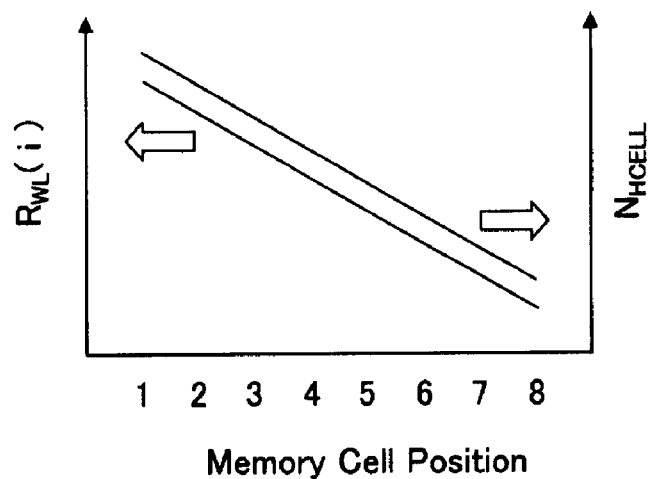
Figure 11C:
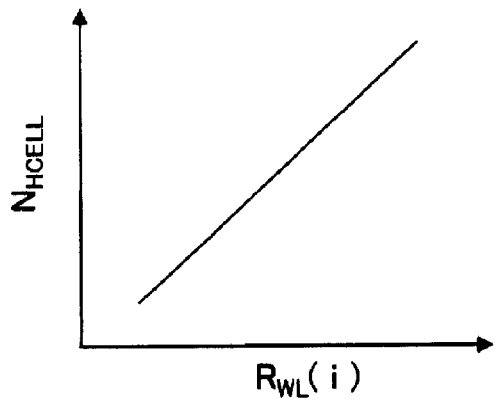

Here, since the relation between the leak current total $I_{LEAK}$ and the number $N_{HCELL}$ of the unselected memory cells in which the resistance value of the memory cell is in the high resistance state is such that the greater the number $N_{HCELL}$ is, the smaller the leak current $I_{LEAK}$ is, the relation shown in FIG. 11B is implemented. That is, as shown in FIG. 11C, at the time of writing operation of one among the memory cell group connected to one word line WL to be written, the wiring resistance $R_{WL}$ (i) of the selected memory cell Mi and the number $N_{HCELL}$ have a positive correlation. Therefore, between the two memory cells Mi and Mj having different writing orders, the writing order is determined such that the relation between each of the wiring resistances $R_{WL}$(i) and $R_{WL}$(j) that are proportional to their memory cell wiring lengths, and the number $N_{HCELL}$ of other unselected memory cells in the high resistance state on the same word line WL at the time of writing of the above memory cell becomes such that the one of the wiring resistances $R_{WL}$(i) and $R_{WL}$(j) having longer memory cell wiring length, that is, higher wiring resistance has the greater number $N_{HCELL}$. When the writing is performed in the determined order, the net program voltage applied to the memory cell M1 can be prevented from varying and writing time can be prevented from being elongated.

On the assumption that 8-bit data is stored in eight memory cells M1 to M8 shown in FIG. 10, a method of determining the writing order in the method of the present invention will be described. One-bit data is stored in each memory cell. FIG. 12 shows four data write examples (cases 1 to 4). In FIG. 12, reference character L designates that the resistance value of the memory cell is in a low resistance state, reference character H designates that the resistance value of the memory cell is in a high resistance state, reference character P designates that the write operation is a programming operation, and reference character E designates that the write operation is an erasing operation. In addition, expected value data after writing is "LHLHLHLH" in each case.

According to the case 1 in FIG. 12, the initial state of the data pattern of the memory cells M1 to M8 is such that all bits are in low resistance states L, and the programming operations P are executed to the four memory cells M8, M6, M4, and M2 in this order. Here, the wiring resistance $R_{WL}$(i) of each of the four memory cells M8, M6, M4, and M2 and the number $N_{HCELL}$ Of the unselected memory cell in the high resistance state are as shown in the following mathematical expressions 1.

Memory cell M8: $R_{WL}(8)=1\times\Delta R_{WL}$, $N_{HCELL}=0$

Memory cell M6: $R_{WL}(6)=3\times\Delta R_{WL}$, $N_{HCELL}=1$

Memory cell M4: $R_{WL}(4)=5\times\Delta R_{WL}$, $N_{HCELL}=2$

Memory cell M2: $R_{WL}(2)=7\times\Delta R_{WL}$, $N_{HCELL}=3$ (Mathematical Expressions 1)

Therefore, when the programming is performed in the memory cells M8, M6, M4 and M2 in this order, that is, the programming is performed in the memory cells in ascending order of the memory cell wiring length, the positive correlation between the wiring resistance $R_{WL}$(i) and $N_{HCELL}$ shown in FIG. 11C is maintained, so that the net program voltage applied to each of the memory cells M8, MG, M4 and M2 can be prevented from varying, and the writing time can be prevented from being elongated.

According to the case 2 in FIG. 12, the initial state of the data pattern of the memory cells M1 to M8 is such that all bits are in high resistance states H, and the erasing operations E are executed to the four memory cells M1, M3, M5, and M7 in this order. Here, the wiring resistance $R_{WL}(i)$ of each of the four memory cells M1, M3, M5, and M7 and the number $N_{HCELL}$ of the unselected memory cell in the high resistance state are as shown in the following mathematical expressions 2.

Memory cell $M1$: $R_{WL}(1)=8\times\Delta R_{WL}$, $N_{HCELL}=7$

Memory cell $M3$: $R_{WL}(3)=6\times\Delta R_{WL}$, $N_{HCELL}=6$

Memory cell $M5$: $R_{WL}(5)=4\times\Delta R_{WL}$, $N_{HCELL}=5$

Memory cell $M7$: $R_{WL}(7)=2\times\Delta R_{WL}$, $N_{HCELL}=4$     (Mathematical Expressions 2)

Therefore, when the erasing is performed in the memory cells M1, M3, M5 and M7 in this order, that is, the erasing is performed in the memory cells in descending order of the memory cell wiring length, the positive correlation between the wiring resistance $R_{WL}(i)$ and the number $N_{HCELL}$ shown in FIG. 11C is maintained, so that the net erase voltage applied to each of the memory cells M1, M3, M5 and M7 can be prevented from varying, and the writing time can be prevented from being increased.

According to the case 3 in FIG. 12, the initial state of the data pattern of the memory cells M1 to M8 is "HLHLHLHL", and the programming operations P are executed to the four memory cells M8, M6, M4, and M2 in this order to generate intermediate data in which all bits are in the high resistance state H like the initial state of the case 2 in FIG. 12. Then, the erasing operations E are executed in the four memory cells M1, M3, M5 and M7 in this order. Here, the wiring resistance $R_{WL}(i)$ of each of the four memory cells M8, M6, M4, and M2 and the number $N_{HCELL}$ of the unselected memory cell in the high resistance state are as shown in the following mathematical expressions 3. In addition, the wiring resistance $R_{WL}(i)$ of each of the four memory cells M1, M3, M5, and M7 and the number $N_{HCELL}$ of the unselected memory cell in the high resistance state are as shown in the following mathematical expressions 4 (the same as the mathematical expressions 2).

Memory cell $M8$: $R_{WL}(8)=1\times\Delta R_{WL}$, $N_{HCELL}=4$

Memory cell $M6$: $R_{WL}(6)=3\times\Delta R_{WL}$, $N_{HCELL}=5$

Memory cell $M4$: $R_{WL}(4)=5\times\Delta R_{WL}$, $N_{HCELL}=6$

Memory cell $M2$: $R_{WL}(2)=7\times\Delta R_{WL}$, $N_{HCELL}=7$     (Mathematical Expressions 3)

Memory cell $M1$: $R_{WL}(1)=8\times\Delta R_{WL}$, $N_{HCELL}=7$

Memory cell $M3$: $R_{WL}(3)=6\times\Delta R_{WL}$, $N_{HCELL}=6$

Memory cell $M5$: $R_{WL}(5)=4\times\Delta R_{WL}$, $N_{HCELL}=5$

Memory cell $M7$: $R_{WL}(7)=2\times\Delta R_{WL}$, $N_{HCELL}=4$     (Mathematical Expressions 4)

Therefore, when the programming is performed in the memory cells M8, M6, M4 and M2 in this order, that is, the programming is performed in the memory cells in ascending order of the memory cell wiring length and then the erasing is performed in the memory cells M1, M3, M5, and M7 in this order, that is, the erasing is performed in the memory cells in descending order of the memory cell wiring length, the relation between the wiring resistance $R_{WL}(i)$ and the number $N_{HCELL}$ becomes the positive correlation as shown in FIG. 11C in each of the programming operation and erasing operation, so that the net program voltage applied to each of the memory cells M8, MG, M4 and M2 and the net erase voltage applied to each of the memory cells M1, M3, M5, and M7 can be prevented from varying, and the writing time can be prevented from being elongated. In addition, since the programming operation is executed prior to the erasing operation, the number $N_{HCELL}$ of unselected memory cells in the high resistance state during a series of writing operations can be largely maintained, so that the leak current can be prevented and the writing time can be more effectively prevented from being increased.

According to the case 4 in FIG. 12, the initial state of the data pattern of the memory cells M1 to M8 is "LLLLHHHH", and the programming operations P are executed to the two memory cells M4 and M2 in this order to generate intermediate data "LHLHHHHH" and then, the erasing operation E is executed in the two memory cells M5 and M7 in this order. Here, the wiring resistance $R_{WL}(i)$ of each of the four memory cells M4, M2, M5, and M7 and the number $N_{HCELL}$ of the unselected memory cell in the high resistance state are as shown in the following mathematical expressions 5.

Memory cell $M4$: $R_{WL}(4)=5\times\Delta R_{WL}$, $N_{HCELL}=4$

Memory cell $M2$: $R_{WL}(2)=7\times\Delta R_{WL}$, $N_{HCELL}=5$

Memory cell $M5$: $R_{WL}(5)=4\times\Delta R_{WL}$, $N_{HCELL}=5$

Memory cell $M7$: $R_{WL}(7)=2\times\Delta R_{WL}$, $N_{HCELL}=4$     (Mathematical Expressions 5)

Therefore, when the programming is performed in the memory cells M4 and M2 in this order, that is, the programming is performed in the memory cells in ascending order of the memory cell wiring length and then the erasing is performed in the memory cells M5 and M7 in this order, that is, the erasing is performed from the memory cells in descending order of the memory cell wiring length, the relation between the wiring resistance $R_{WL}(i)$ and the number $N_{HCELL}$ becomes the positive correlation as shown in FIG. 11C in each of the programming operation and erasing operation, so that the net program voltage applied to each of the memory cells M4 and M2 and the net erase voltage applied to each of the memory cells M5 and M7 can be prevented from varying, and the writing time can be prevented from being increased.

Although the data pattern in the initial state has been previously read and it is compared with the expected value data "LHLHLHLH" after writing and the memory cell group to be programmed and the memory cell group to be erased are classified based on the comparison result in the above cases 3 and 4, the memory cell group to be programmed and the memory cell group to be erased may be classified using only each bit resistance state of the expected value data "LHLHLHLH". In this case, in the case 4, similar to the case 3, the programming operation is to be performed in the four memory cells M8, M6, M4 and M2 and the erasing operation is to be performed in the four memory cells M1, M3, M5 and M7. However, in the actual programming and erasing operations, since the memory cells M8 and M6 have been programmed and the memory cells M1 and M3 have been erased, unnecessary writing operation can be avoided by performing verification before the writing operation.

Next, a description will be made of the processing procedure of the sequential writing operation to the memory cell group connected to one word line WL according to the method of the present invention with reference to a flowchart shown in FIG. 13.

Figures 13A, 13B:
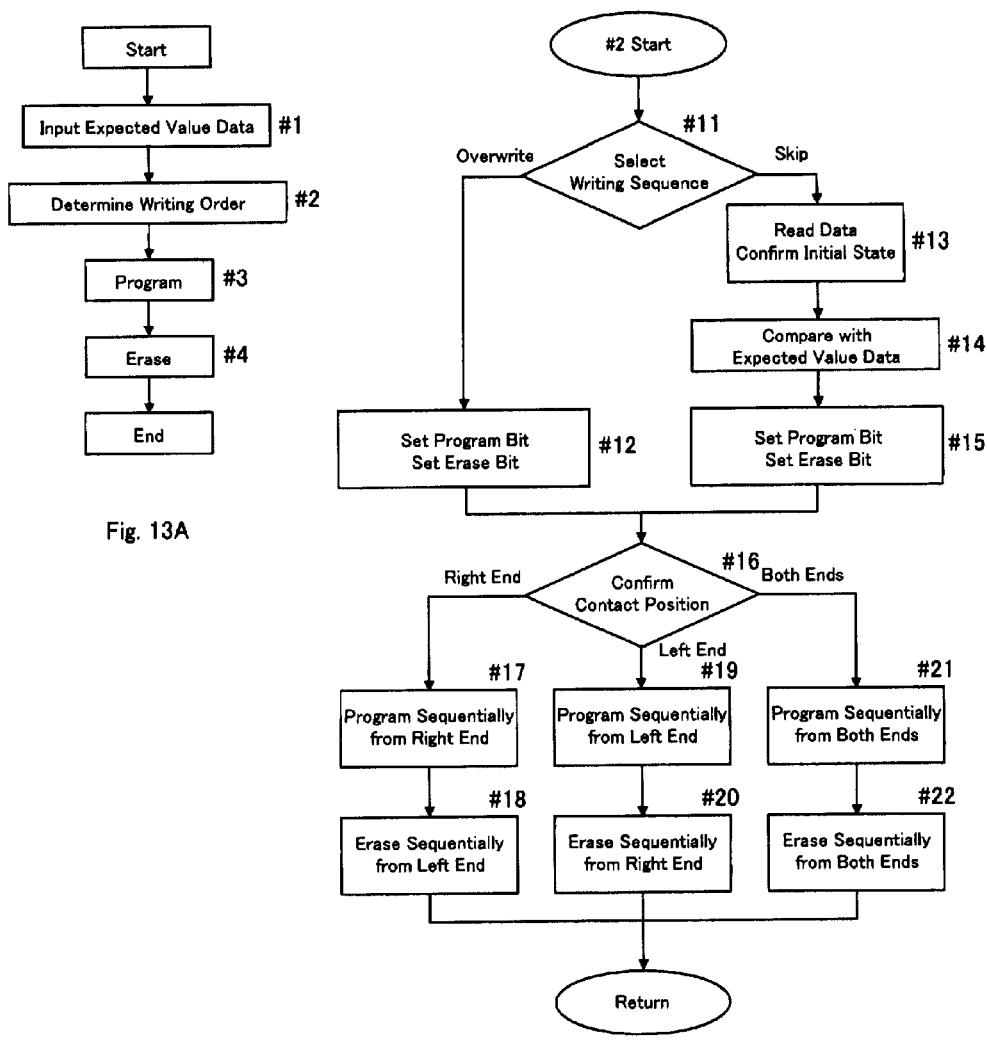
FIG. 13 is a flowchart showing a processing procedure of a sequential writing operation for a memory cell group connected to one word line according to the data writing method of an example embodiment.

First, as an entire flow, as shown in FIG. 13A, expected value data after writing is inputted from the outside (at step #1), and the writing order of the inputted expected value data is determined (at step #2). Then, according to the determined writing order, programming is performed to the memory cells to be programmed (step #3) and then, erasing is performed to the memory cells to be erased after the programming according to the determined writing order (at step #4) and the procedure is completed. Here, the inputted expected value data contains a head address and a data amount of the expected value data, or the head address and a last address of the expected value data. In addition, the writing order is determined for each of the programming operation and the erasing operation according to the position of the contact of the word line to be written. Furthermore, the memory cell to be actually programmed is specified by the expected value data and the data pattern in the initial state.

FIG. 13B shows the processing procedure for determining the writing order (step #2) in detail.

First, a writing sequence (overwrite or skip) is selected (at step #11), and in the case of the overwrite sequence, the H data of the expected value data (the resistance value of the memory cell is in the high resistance state) is defined as a program bit and L data (the resistance value of the memory cell is in the low resistance state) is defined as an erase bit (at step #12).

Meanwhile, in the case of the skip sequence, the stored data in all of the memory cells to be written before writing is read out and the data pattern in the initial state is confirmed (at step #13). Then, the expected value data and the data pattern in the initial state are compared (at step #14) and a bit (memory cell) in which the expected value data and the data pattern in the initial state are different is extracted and the H data of the expected value data is defined as the program bit and the L data thereof is defined as the erase bit in the extracted bit (at step #15).

Then, the position of the contact of the word line to be written is confirmed (at step #16). At the time of programming, the programming order is determined so that the programming is executed from the memory cell closer to the contact to the memory cell further from it among the plurality of memory cells connected to the same word line. Meanwhile, at the time of erasing following the programming operation, the erasing order is determined so that the erasing is executed from the memory cell further from the contact to the memory cell closer to it among the plurality of memory cells connected to the same word line.

More specifically, when the contact exits at the right end of the word line to be written, the programming order is determined so that the programming is sequentially performed from the right end (at step #17) and the erasing order is determined so that the erasing is sequentially performed from the left end (at step #18).

In addition, when the contact exits at the left end of the word line to be written, the programming order is determined so that the programming is sequentially performed from the left end (at step #19) and the erasing order is determined so that the erasing is sequentially performed from the right end (at step #20).

Furthermore, when the contacts exit at both ends of the word line to be written, the programming order is determined so that the programming is sequentially performed from both ends (at step #21) and the erasing order is determined so that the erasing is sequentially performed from the center (at step #22).

In addition, in the processing procedure after the step #16, when the contacts are positioned in two ways: some are positioned at right end of the word line while others are positioned at left end of the word line according to the row address of the word line in the actual memory cell array, the steps #21 and #22 are not needed. In addition, when the contact are positioned at both right and left ends of the word line regardless of the row address of the word line, the confirmation at the step #16 and the steps #17 to #20 are not needed.

Furthermore, in the process for determining the writing order at the step #2, the determination of programming order for the programming operation at the step #3 may be performed at the same time as the programming operation at the step #3, and the determination of the erasing order for the erasing operation at the step #4 may be performed at the same time as the erasing operation at the step #4.

EXAMPLE 1

Figure 6:
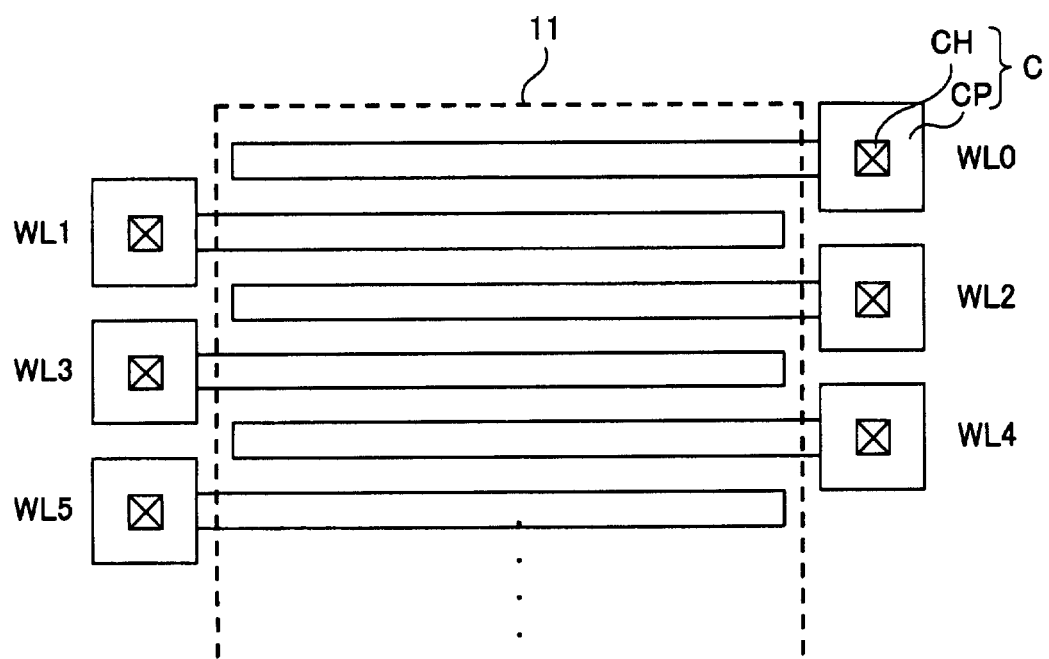
FIG. 6 is a layout view showing an arrangement example of a contact formed at the end of a word line.
Figure 7:
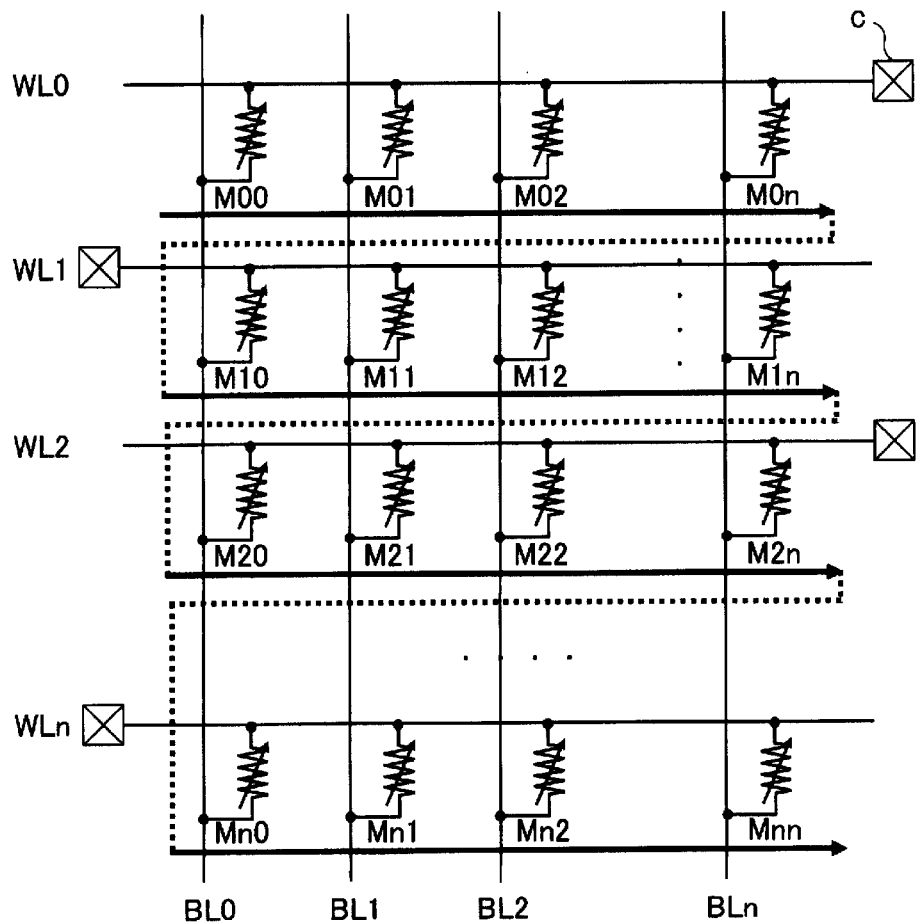
FIG. 7 is a view showing a conventional programming order when data is sequentially programmed in the memory cells along the word line.

A description will be made of a case where data is sequentially written along the word lines in the memory cell array in which the contact C of the word line is positioned in two ways: some are positioned at the right end while others are positioned at the left end according to the row address of the word line as shown in FIG. 6. Specifically, the contacts of the word line are positioned at the right ends in the even-numbered word lines WL0, WL2, WL4, . . . , and they are positioned at the left ends in the odd-numbered word lines WL1, WL3, WL5, . . . In addition, the reason why the contacts C are positioned as shown in FIG. 6 has been already described in the above "problems to be solved by the Invention". A description will be made of the case where the programming is sequentially executed on the assumption that the memory cell array is controlled such that the resistance values of all memory cells are in the low resistance state (erase state) in the initial state before writing.

Figure 14:
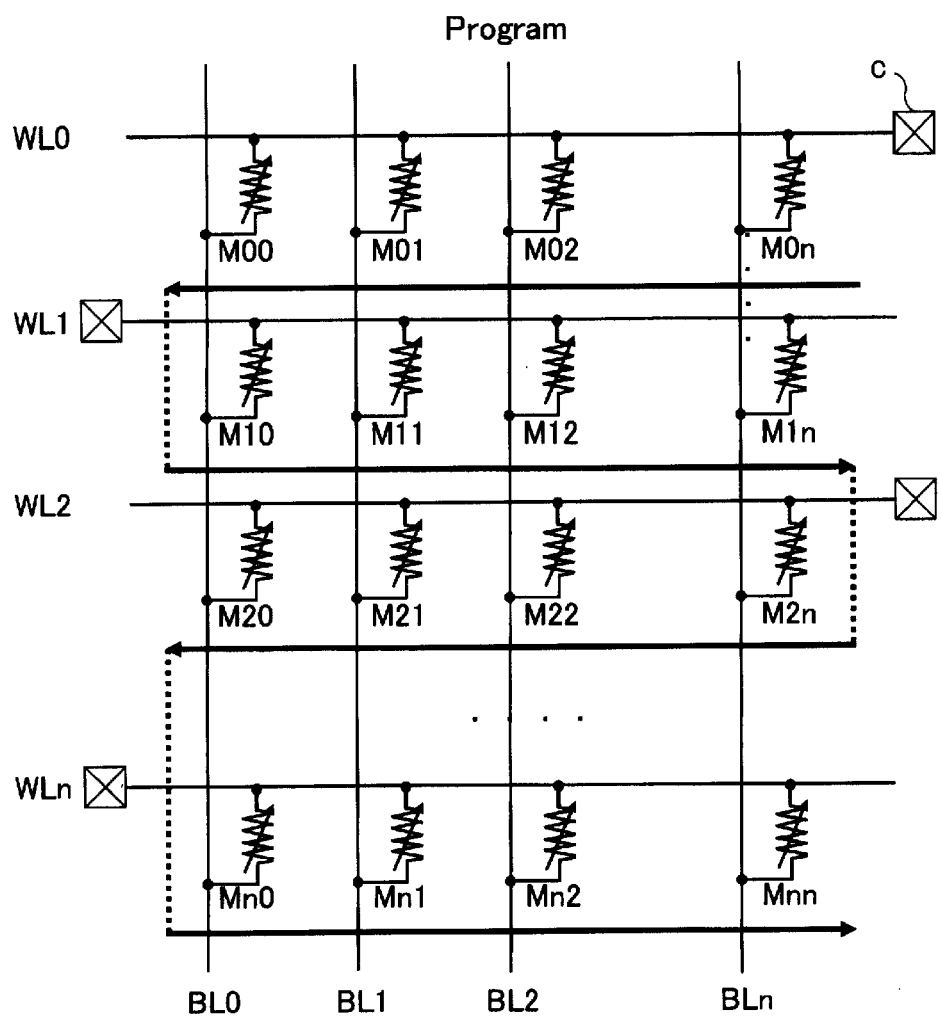
FIG. 14 is a view showing a programming procedure (example 1) in a writing order determined by the data writing method of the example embodiment in the case of the contact arrangement of the word line shown in FIG. 6.

According to the method of an example embodiment, as shown in FIG. 14, the access order to each memory cell for writing is such that the word line WL0 designated by the lowest-order row address is selected first, and the bit line BLn designated by the highest-order column address is selected to program data in the memory cell M0n connected to the word line WL0 and the bit line BLn. Then, while the same word line WL0 is selected, the column address is decreased to select the bit lines BL1 to BLn reversely to program data sequentially in the memory cells M0n−1, M0n−2, . . . , M00. After data has been programmed in all memory cells connected to the word line WL0, the row address is increased by one to select the word line WL1, keeping the column address at the lowest-order address to select the bit line BL0 and data is programmed in the memory cell M10 connected to the word line WL1 and the bit line BL0. Similarly, while the word line WL1 is selected, the column address is increased to sequentially select the bit lines BL1 to BLn and data is sequentially programmed in the memory cells M11, M12, . . . , M1n. After data has been programmed in all of the memory cells connected to the word line WL1, similarly, the row address is increased by one. Thus, in the even-numbered word line WLi, the column address is decreased from the highest-order column address to select the bit line BL0 to BLn reversely to program data in the memory cells Min, Min−1, . . . , Mi0 sequentially. Meanwhile, in the odd-numbered word line WLj, the column address is increased from the lowest-order column address to select the bit line BL0 to BLn sequentially to program data in the memory cells Mj0, Mj1, . . . Mjn. Thus, data is programmed sequentially in all memory cells connected to the word lines WL2 to WLn.

In addition, at the time of programming in each memory cell, the program voltage Vpp, a middle voltage Vpp/2 which is one half of the program voltage Vpp, a ground voltage Vss, and the middle voltage Vpp/2 are applied to the selected word line, unselected word lines, the selected bit line and unselected bit lines, respectively. As a result, the write voltage Vpp is applied to both ends of the selected memory cell, and the middle voltage Vpp/2 is applied to the unselected memory cell connected to the selected bit line and the selected word line, respectively, and a voltage is not applied to the other unselected memory cells. Here, when the lower limit value of the program voltage (absolute value) required for the programming in the memory cell is set so as to be higher than the middle voltage Vpp/2 (absolute value), data is prevented from being programmed in the unselected memory cells to which the middle voltage Vpp/2 is applied.

Thus, by executing the programming from the memory cell closer to the contact C to the memory cell further from it in the memory cells connected to the same word line, when data is programmed in the memory cell having high wiring resistance and positioned further from the contact C of the word line, a leak current in the unselected memory cell can be prevented. As a result, the program current to the selected memory cell can be prevented from being reduced and the programming time can be shortened. As a result, the variation in the programming time to the memory cell connected to the same word line can be reduced and the resistance value after the programming can be easily controlled.

EXAMPLE 2

Figure 15:
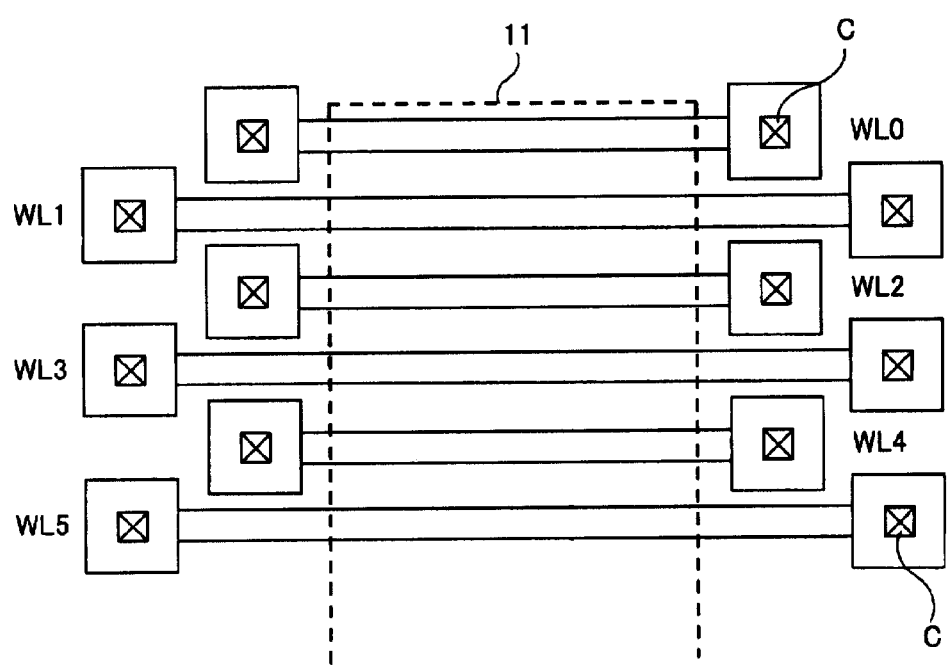
FIG. 15 is a layout view showing another arrangement example of the contact formed at the end of the word line.

A description will be made of a case where data is sequentially written along word lines in a memory cell array in which contacts C are positioned at both right and left ends of the word line regardless of the row address of the word line as shown in FIG. 15. In addition, the arrangement of the contact C as shown in FIG. 15 can be implemented by devising the layout of a contact pad or enlarging the wiring distance between the word lines. A description will be made of a case where data is sequentially programmed in a memory cell array in which resistance values of all memory cells are controlled to be in the low resistance state (erase state) in the initial state before writing, hereinafter.

Figure 16:
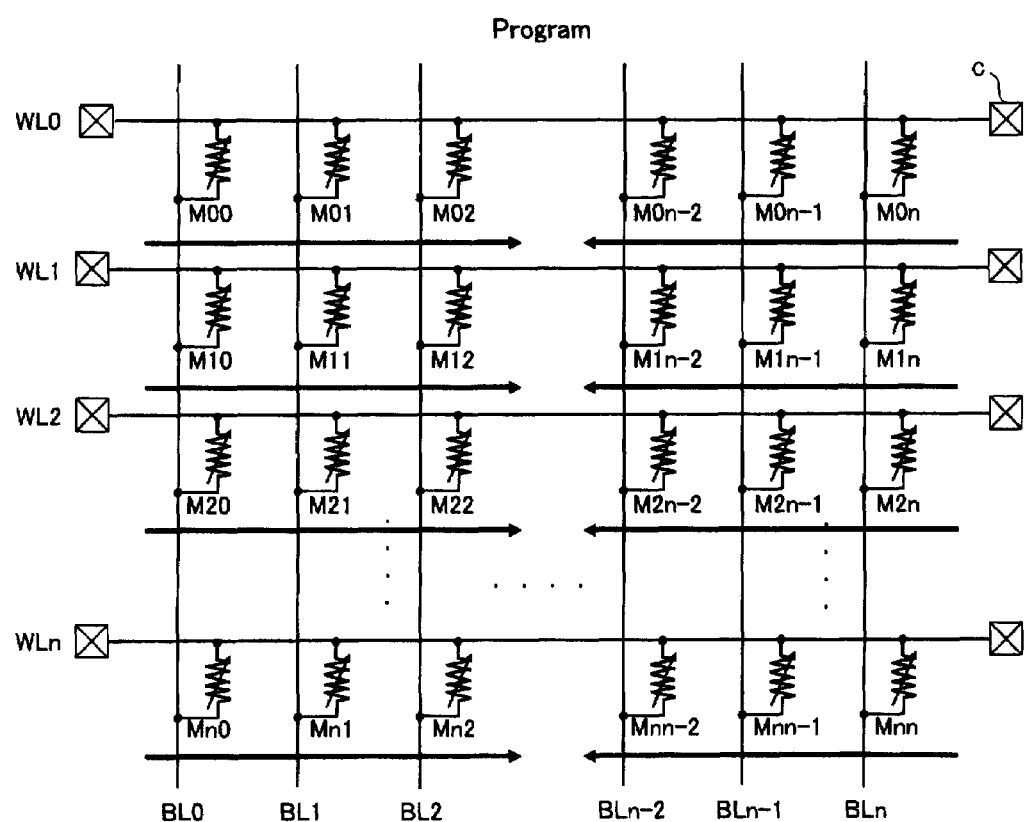
FIG. 16 is a view showing a programming procedure (example 2) in a writing order determined by the data writing method of the example embodiment in the case of the contact arrangement of the word line shown in FIG. 15.

According to the method of an example embodiment, as shown in FIG. 16, the access order to each memory cell for programming is such that a word line WL0 designated by the lowest-order row address is selected first and then a bit line BL0 designated by the lowest-order column address is selected to program data in a memory cell M00 connected to the word line WL0 and the bit line BL0. Continuously, while the same word line WL0 is selected, the column address is increased by "n" to select the bit line BLn designated by the highest-order column address to program data in the memory cell M0n connected to the word line WL0 and the bit line BLn. Continuously, while the same word line WL0 is selected, the column address is decreased by (n−1) to select the bit line BL1 to program data in the memory cell M01 connected to the word line WL0 and the bit line BL1. Continuously, the column address is increased by (n−2) to select the bit line BLn−1 to program data in the memory cell M0n−1 connected to the word line WL0 and the bit line BLn−1. Similarly, while the word line WL0 is selected, the decrease width and increase width in increasing and decreasing the column address are sequentially narrowed to select the bit line alternately from both ends toward the central bit line of the word line WL0 to program data in the memory cells M02, M0n−2, M03, M0n−3, . . . positioned alternately from both ends of the word line. After data has been programmed in all memory cells connected to the word line WL0, the row address is increased by one to select the word line WL1 and the column address is increased and decreased to narrow its increase width and decrease width from the lowest-order address to alternately select the bit lines designated by these column addresses from both ends of the word line WL1 to program data in the memory cells M10, M1n, M11, M1n−1, M12, M1n−2, . . . in this order in the same way as in the word line WL0. Similarly, the row address is increased one by one to sequentially program data in all memory cells connected to the word lines WL2 to WLn. In addition, since the voltage applying condition to the selected word line, the unselected word line, the selected bit line, and the unselected bit line in the programming operation of each memory cell is the same as in the example 1, its description will be omitted.

Thus, since the programming operation is sequentially performed in the memory cells connected to the same word line from the side closer to the contact C to the side further from the contact C, when data is programmed in the memory cell that is positioned in the center far away from the contact C and has high wiring resistance in the word line, a leak current in the unselected memory cell can be prevented, so that the program current to the selected memory cell can be prevented from being reduced and the programming time can be shortened. As a result, the variation in the programming time of the memory cell connected to the same word line can be reduced and the resistance value after the programming can be easily controlled.

EXAMPLE 3

A description will be made of a case where data is sequentially written along the word lines in the memory cell array in which the contact C of the word line is positioned in two ways: some are positioned at the right end while others are positioned at the left end according to the row address of the word line as shown in FIG. 6. Specifically, the contacts of the word line are positioned at the right ends in the even-numbered word lines WL0, WL2, WL4, . . . , and they are positioned at the left ends in the odd-numbered word lines WL1, WL3, WL5 . . . . According to this example 3, a description will be made of a case where the erasing is sequentially executed on the assumption that the memory cell array is controlled such that the resistance values of all memory cells are in the high resistance state (program state) in the initial state before writing.

Figure 17:
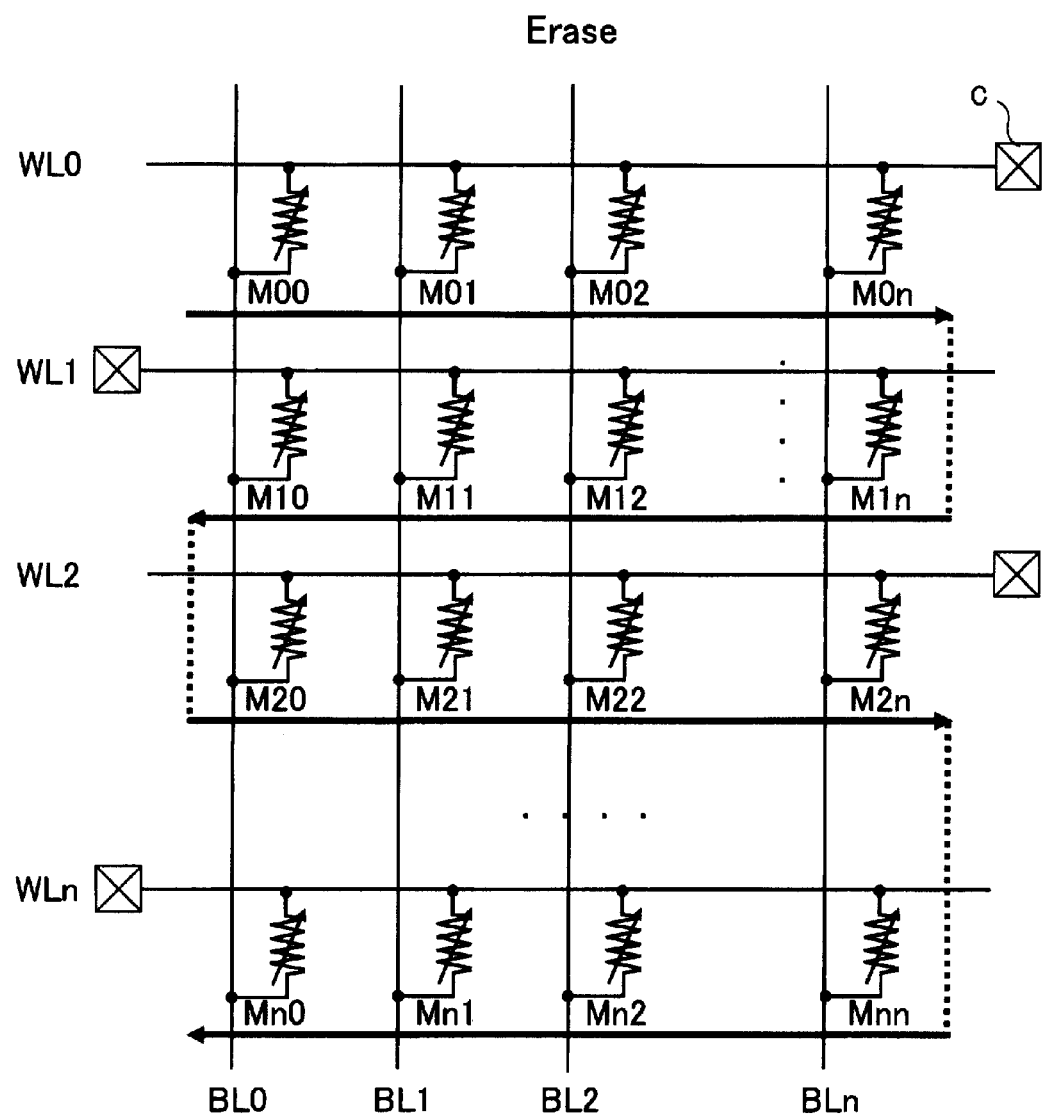
FIG. 17 is a view showing an erasing procedure (example 3) in a writing order determined by the data writing method of the example embodiment in the case of the contact arrangement of the word line shown in FIG. 6.

According to the method of an example embodiment, as shown in FIG. 17, the access order to each memory cell for erasing is such that the word line WL0 designated by the lowest-order row address is selected first, and the bit line BL0 designated by the lowest-order column address is selected to erase data in the memory cell M00 connected to the word line WL0 and the bit line BL0. Then, while the same word line WL0 is selected, the column address is increased to select the bit lines BL1 to BLn sequentially, and data is sequentially erased in the memory cells M01, M02, . . . , M0n. After data has been erased in all memory cells connected to the word line WL0, while the row address is increased by one to select the word line WL1, the column address is kept at the highest-order address to select the bit line BLn and data is erased in the memory cell M1n connected to the word line WL1 and the bit line BLn. Similarly, while the word line WL1 is selected, the column address is decreased to select the bit lines BL1 to BLn reversely and data is sequentially erased in the memory cells M1n−1, M1n−2, . . . , M10. After data has been erased in all of the memory cells connected to the word line WL1, similarly, the row address is increased one by one. Thus, in the even-numbered word line WLi, the column address is increased from the lowest-order column address to select the bit line BL0 to BLn sequentially to erase data in the memory cells Mi0, Mi1, ..., Min. Meanwhile, in the odd-numbered word line WLj, the column address is decreased from the highest-order column address to select the bit line BL0 to BLn reversely to erase data in the memory cells Mjn, Mjn−1, ..., Mj0. Thus, data is erased sequentially in all memory cells connected to the word lines WL2 to WLn.

In addition, at the time of erasing in each memory cell, the ground voltage Vss, a middle voltage Vpp/2 which is one half of an erase voltage Vpp, the erase voltage Vpp, and the half voltage Vpp/2 are applied to the selected word line, the unselected word line, the selected bit line and the unselected bit line, respectively. As a result, the erase voltage (−Vpp) is applied to both ends of the selected memory cell, and the middle voltage (−Vpp/2) is applied to the unselected memory cell connected to the selected bit line and the selected word line, and a voltage is not applied to the other unselected memory cells. Here, when the lower limit value of the erase voltage (absolute value) required for erasing the data in the memory cell is set so as to be higher than the middle voltage Vpp│2 (absolute value), data is prevented from being erased in the unselected memory cell to which the middle voltage (−Vpp/2) is applied.

Thus, by erasing data from the memory cell further away from the contact C to the memory cell closer to it in the memory cells connected to the same word line, when data is erased in the memory cell having high wiring resistance and positioned further from the contact C of the word line, a leak current in the unselected memory cell can be prevented. As a result, an erase current to the selected memory cell can be prevented from being reduced, and the erasing time can be shortened. As a result, the variation in the erasing time in the memory cells connected to the same word line can be reduced and the resistance value after the erasing can be easily controlled.

EXAMPLE 4

A description will be made of a case where data is sequentially written along word lines in a memory cell array in which contacts C are positioned at both right and left ends of the word line regardless of a row address of the word line as shown in FIG. 15. In this example 4, a description will be made of a case where data is sequentially erased in a memory cell array in which resistance values of all memory cells are controlled to be in the high resistance state (program state) in the initial state before writing, hereinafter.

Figure 18:
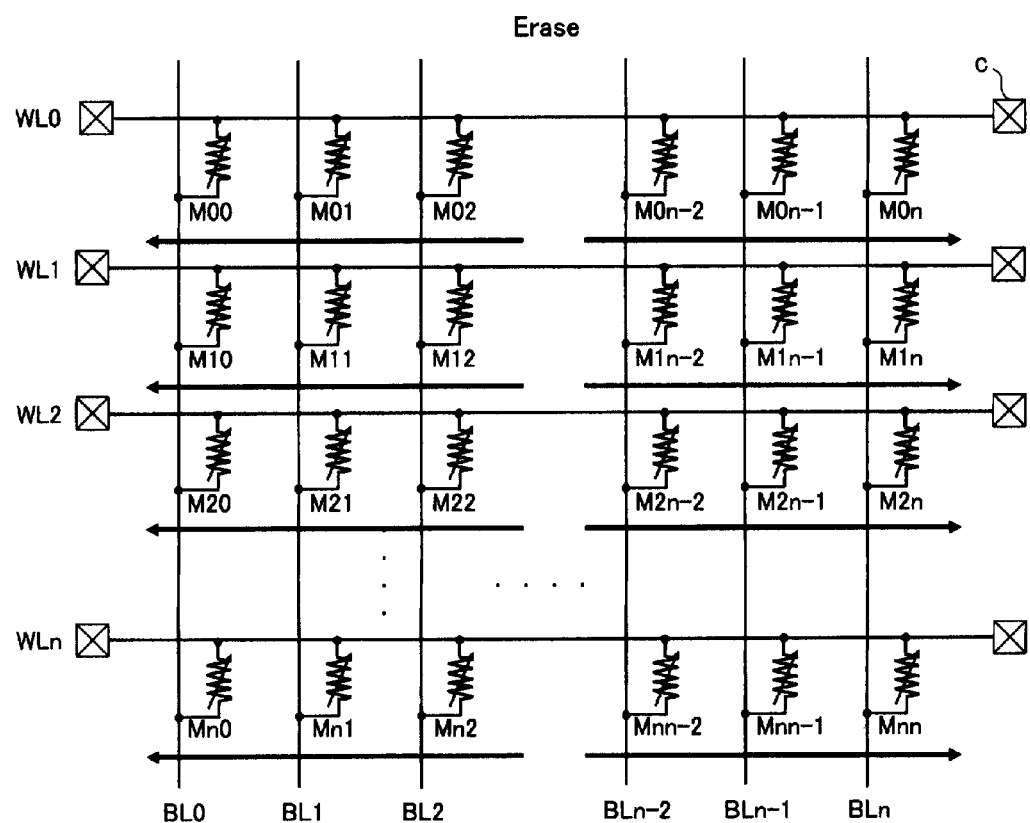
FIG. 18 is a view showing an erasing procedure (example 4) in a writing order determined by the data writing method of the example embodiment in the case of the contact arrangement of the word line shown in FIG. 15.

According to the method of an example embodiment, as shown in FIG. 18, an access order to each memory cell for erasing is such that a word line WL0 designated by the lowest-order row address is selected first and then a bit line BLm designated by the middle column address (when n is an odd number, m=(n−1)/2) is selected to erase data in the memory cell M0m connected to the word line WL0 and the bit line BLm. Continuously, while the same word line WL0 is selected, the column address is increased by one to select the bit line BLm+1 designated by the column address (m+1) to erase data in the memory cell M0m+1 connected to the word line WL0 and the bit line BLm+1. Continuously, while the same word line WL0 is selected, the column address is decreased by two to select the bit line BLm−1 to erase the data in the memory cell M0m−1 connected to the word line WL0 and the bit line BLm−1. Continuously, the column address is increased by three to select the bit line BLm+2 to erase data in the memory cell M0m+2 connected to the word line WL0 and the bit line BLm+2. Similarly, while the word line WL0 is selected, the bit lines are selected alternately from the center toward both ends of the word line WL0 by gradually increasing decrease width and the increase width of the decrease and increase in the column address to erase the data in the memory cells M0m−2, M0m+3, M0m−3, M0m+4, ... M00, M0n positioned alternately from the center of the word line. After data has been erased in all memory cells connected to the word line WL0, the row address is increased by one to select the word line WL1 and the column address is increased and decreased to increase its increase width and decrease width from the middle column address to alternately select the bit lines designated by these column addresses from the center of the word line WL1 to erase the data in the memory cells M1m, M1m+1, M1m−1, M1m+2, M1m−2, M1m+3, ... M10, M1n in this order in the same way as in the word line WL0. Similarly, the row address is increased one by one to sequentially erase the data in all memory cells connected to the word lines WL2 to WLn. In addition, since the voltage applying condition to the selected word line, the unselected word line, the selected bit line, and the unselected bit line in the erasing operation of each memory cell is the same as in the example 3, its description will be omitted.

Thus, since the erasing operation is sequentially performed in the memory cells connected to the same word line from the center side further away from the contact C to the side closer to the contact C, when data is erased in the memory cell that is positioned in the center far away from the contact C and having high wiring resistance in the word line, a leak current to the unselected memory cell can be prevented, so that the erase current to the selected memory cell can be prevented from being reduced and the erasing time can be shortened. As a result, the variation in the erasing time of the memory cell connected to the same word line can be reduced and the resistance value after the erasing can be easily controlled.

EXAMPLE 5

Figure 19:
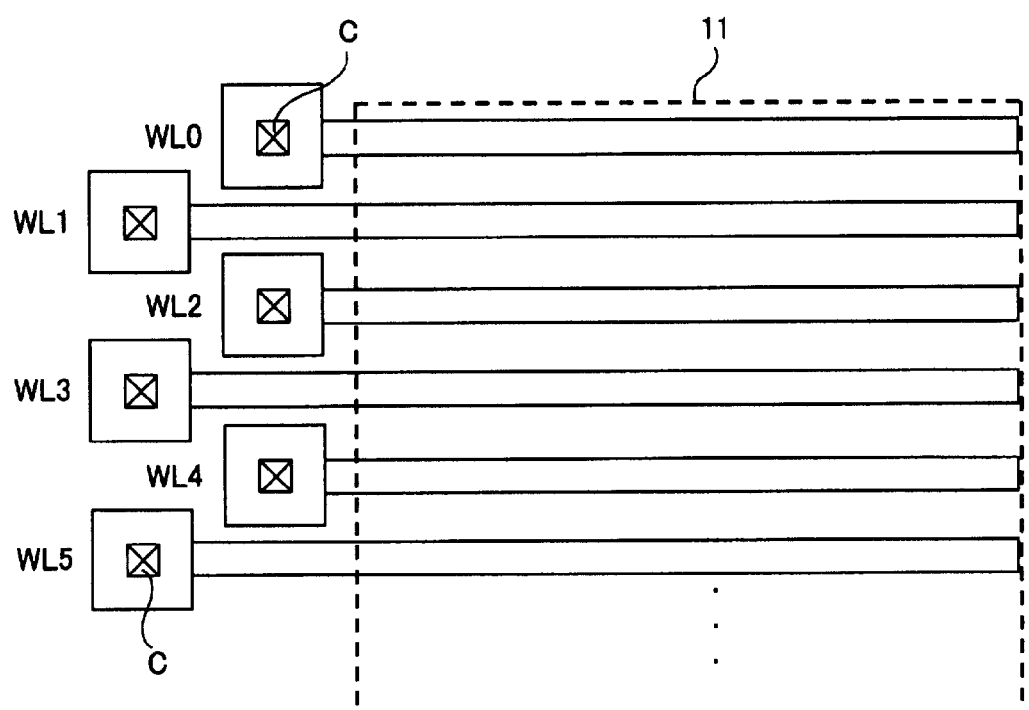
FIG. 19 is a layout view showing another arrangement example of the contact formed at the end of the word line.

A description will be made of a case where data is sequentially written along the word lines in a memory cell array in which the contact C of the word line is positioned at the left end regardless of the column address of the word line as shown in FIG. 19. In this example 5, a description will be made of the case where programming is sequentially executed on the assumption that the memory cell array is controlled such that the resistance values of all memory cells are in the low resistance state (erase state) in the initial state before writing.

Figure 20:
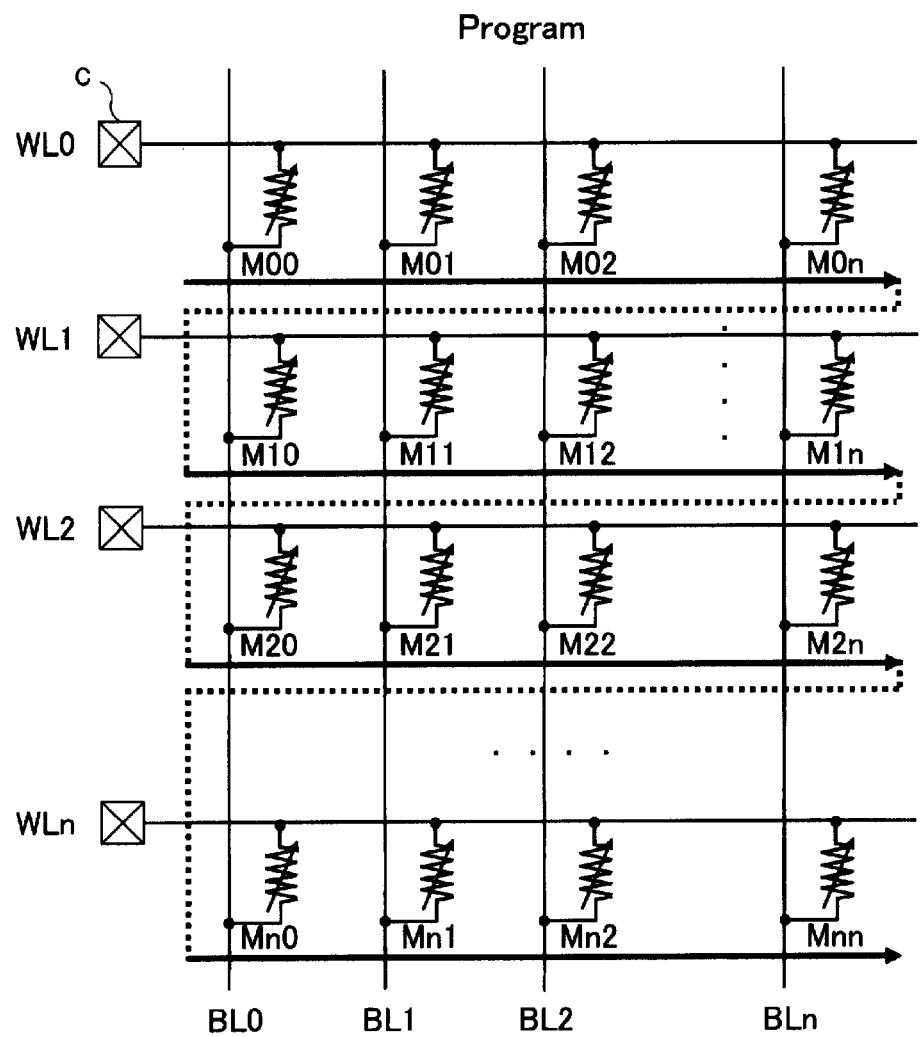
FIG. 20 is a view showing a programming procedure (example 5) in a writing order determined by the data writing method of the example embodiment in the case of the contact arrangement of the word line shown in FIG. 19.

According to the method of an example embodiment, as shown in FIG. 20, the access order to each memory cell for programming is such that the word line WL0 designated by the lowest-order row address is selected first, and the bit line BL0 designated by the lowest-order column address is selected to program data in the memory cell M00 connected to the word line WL0 and the bit line BL0. Then, while the same word line WL0 is selected, the column address is increased to select the bit lines BL1 to BLn sequentially to program data sequentially in the memory cells M01, M02, ..., M0n. After data has been programmed in all memory cells connected to the word line WL0, the row address is increased one by one to program data in all of the memory cells connected to the word lines WL1 to WLn. In addition, since the voltage applying condition to the selected word line, the unselected word line, the selected bit line, and the unselected bit line in the programming operation of each memory cell is the same as in the example 1, its description will be omitted.

Thus, since the programming operation is sequentially performed in the memory cells connected to the same word line from the side closer to the contact C to the side further from the contact C, when data is programmed in the memory cell positioned far away from the contact C and having high wiring resistance in the word line, a leak current in the unselected memory cell can be prevented, so that the program current to the selected memory cell can be prevented from being reduced and the programming time can be shortened. As a result, the variation in the programming time of the memory cell connected to the same word line can be reduced and the resistance value after the programming can be easily controlled.

EXAMPLE 6

A description will be made of a case where data is sequentially written along word lines in a memory cell array in which the contact C of the word line is positioned at the left end regardless of the column address of the word line as shown in FIG. 19. In this example 6, a description will be made of the case where erasing is sequentially executed on the assumption that the memory cell array is controlled such that the resistance values of all memory cells are in the high resistance state (program state) in the initial state before writing.

Figure 21:
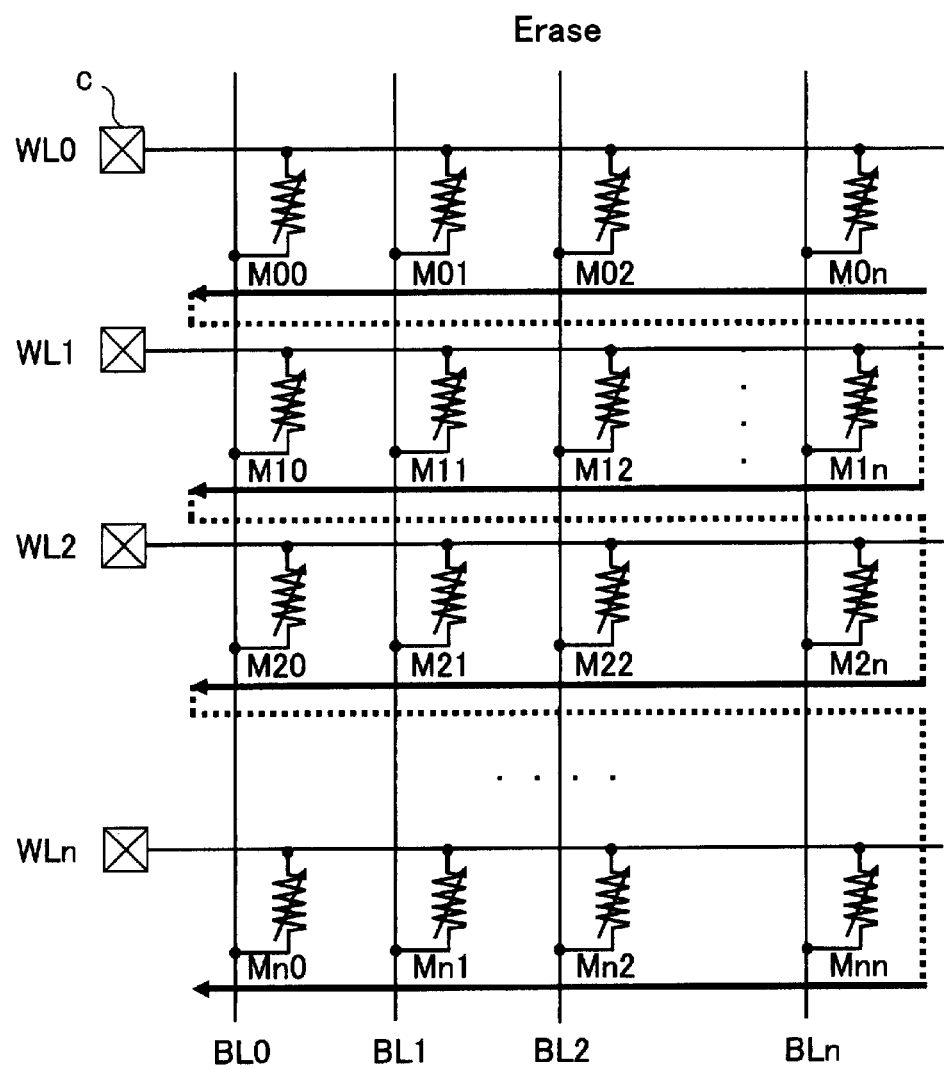
FIG. 21 is a view showing an erasing procedure (example 6) in a writing order determined by the data writing method of the example embodiment in the case of the contact arrangement of the word line shown in FIG. 19.

According to the method of an example embodiment, as shown in FIG. 21, the access order to each memory cell for erasing is such that the word line WL0 designated by the lowest-order address row address is selected first, and the bit line BLn designated by the highest-order column address is selected to erase data in the memory cell M0$n$ connected to the word line WL0 and the bit line BLn. Then, while the same word line WL0 is selected, the column address is decreased to select the bit lines BL0 to BLn−1 reversely to erase data sequentially in the memory cells M0$n$−1, M0$n$−2, . . . , M00. After data has been erased from all memory cells connected to the word line WL0, the row address is increased one by one to erase the data in all of the memory cells connected to the word lines WL1 to WLn. In addition, since the voltage applying condition to the selected word line, the unselected word line, the selected bit line, and the unselected bit line in the erasing operation of each memory cell is the same as in the example 3, its description will be omitted.

Thus, since the erasing operation is sequentially performed in the memory cells connected to the same word line from the side further from the contact C to the side closer to the contact C, when data is erased in the memory cell positioned far away from the contact C and having high wiring resistance in the word line, a leak current to the unselected memory cell can be prevented, so that the erase current to the selected memory cell can be prevented from being reduced and the erasing time can be shortened. As a result, the variation in the erasing time of the memory cell connected to the same word line can be reduced and the resistance value after the erasing can be easily controlled.

Next, a description will be made of an effect to prevent a decrease in the program current and an effect to prevent variations in program current, and an effect to prevent an increase in the programming time and an effect to prevent variations in the programming time according to the method of an example embodiment, based on a simulation result.

On the assumption that eight memory cells are connected to one word line, a simulation has been done as follows. That is, in the case of programming by changing the resistance values of all the memory cells from the low resistance state to the high resistance state, a simulation has been done when programming is performed in the programming order according to the present invention (sequentially from the memory cell closer to the contact to the memory cell further from the contact) and when programming is performed in the programming order according to the conventional method (sequentially from the memory cell further from the contact to the memory cell closer to the contact) and the distribution in the program current and the programming time have been compared.

Figure 22:
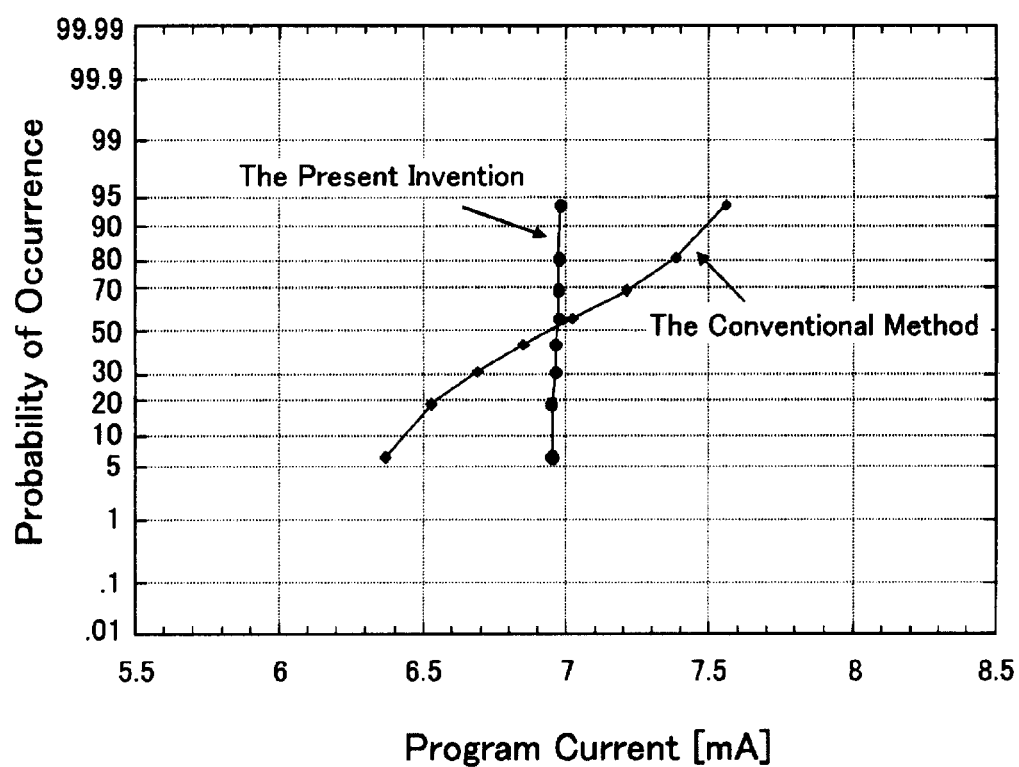
FIG. 22 is a view showing a comparison result of program current distributions between a programming order according to the example embodiment and a programming order according to a conventional method.

FIG. 22 shows the result of the comparison in the distribution of the program current in the programming order according to the method of an example embodiment and the programming order according to the conventional method. Although the average value of the program current is the same in the method of the present invention and the conventional method, it has been found that the minimum value and the variation width (|maximum value−minimum value|) of the program current are considerably improved in the method of the present invention.

Figure 8:
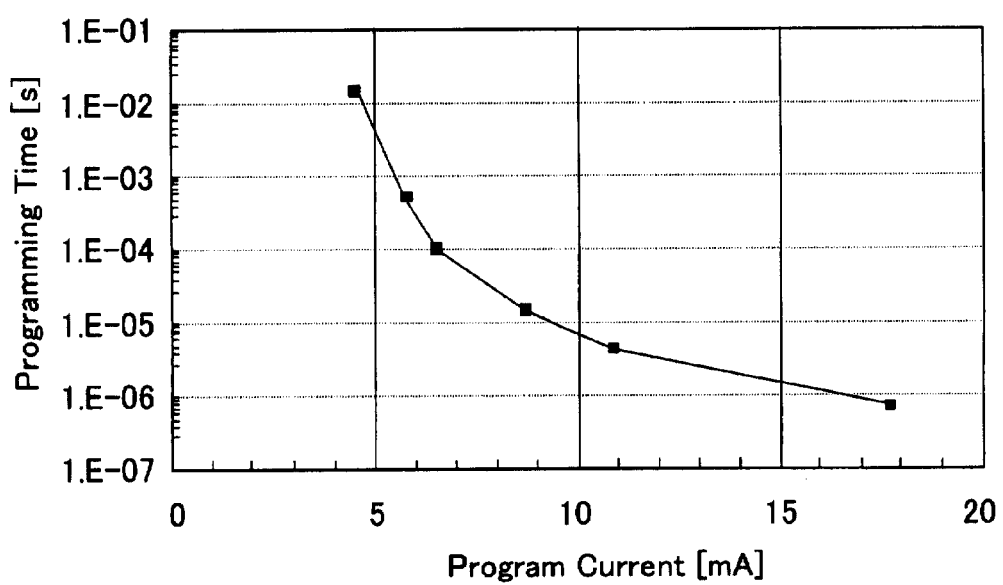
FIG. 8 is a characteristic diagram showing one example of the relation between a program current and a programming time in a variable resistive element that can store data by an electric resistance change by the application of an electric stress.
Figure 9:
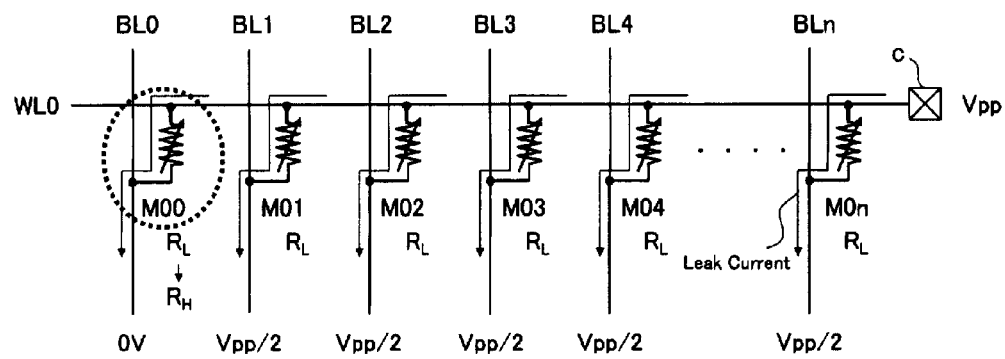
FIG. 9 is a view to explain the relation between a writing order and a leak current.
Figure 23:
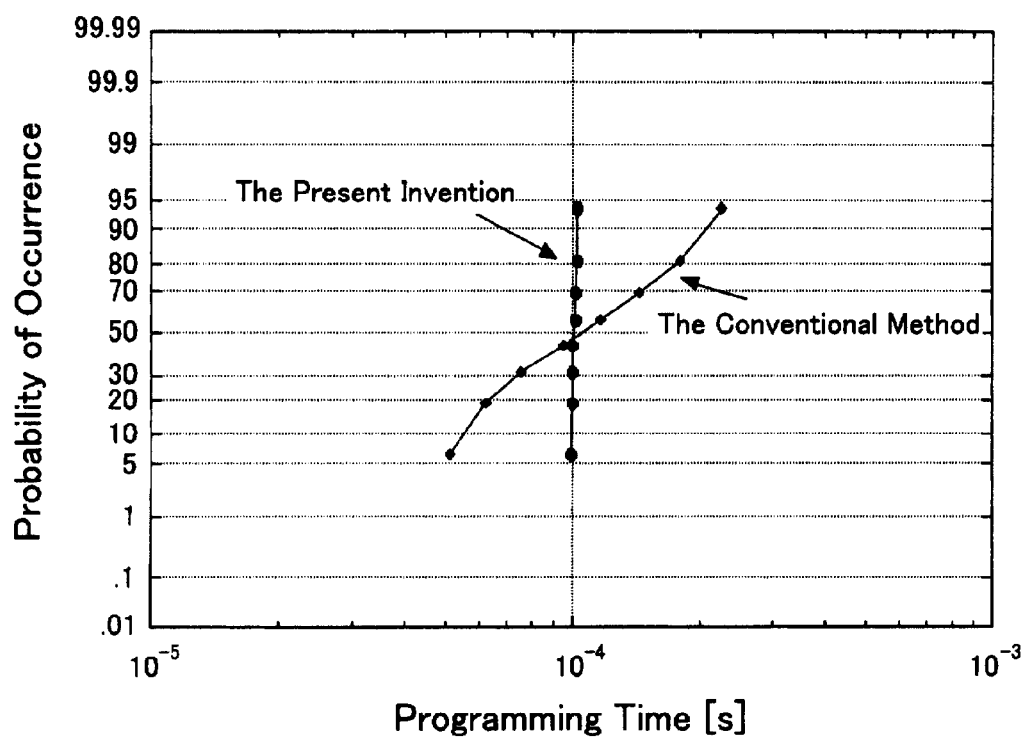
FIG. 23 is a view showing a comparison result of programming time distributions between a programming order according to the example embodiment and a programming order according to a conventional method.

FIG. 23 shows a result in which the distribution of the programming time is calculated by applying the relation between the program current and the programming time shown in FIG. 8 to the simulation result shown in FIG. 22. Although the average value of the programming time is the same in the method of the example embodiment and the conventional method as shown in FIG. 23, it has been found that the maximum value and the variation width (|maximum value−minimum value|) of the programming time are considerably improved in the method of the example embodiment. Furthermore, while a total programming time to the all the memory cells is 952 μs in the conventional method, it is 811 μs in the method of the present invention, which is shortened to 85% of the total programming time in the conventional method. This is because the programming time and the program current have an exponential relation, due to method of the example embodiment, the effect of shortening the programming time in the memory cells which take longer time to be programmed is greater than the effect of elongating the programming time in the memory cells which take shorter time to be programmed.

Therefore, when a large amount of data is written, the variations in the programming time and the erasing time can be reduced and the total writing time can be shortened. In addition, when the variations in the programming time and the erasing time are reduced, the resistance value after the programming and erasing can be easily controlled. Furthermore, since the memory cell in which the programming and erasing are fast is prevented from existing and the program current and the erase current are prevented from flowing more than necessary, the memory cell having high reliability can be implemented.

Second Embodiment

Figure 24:
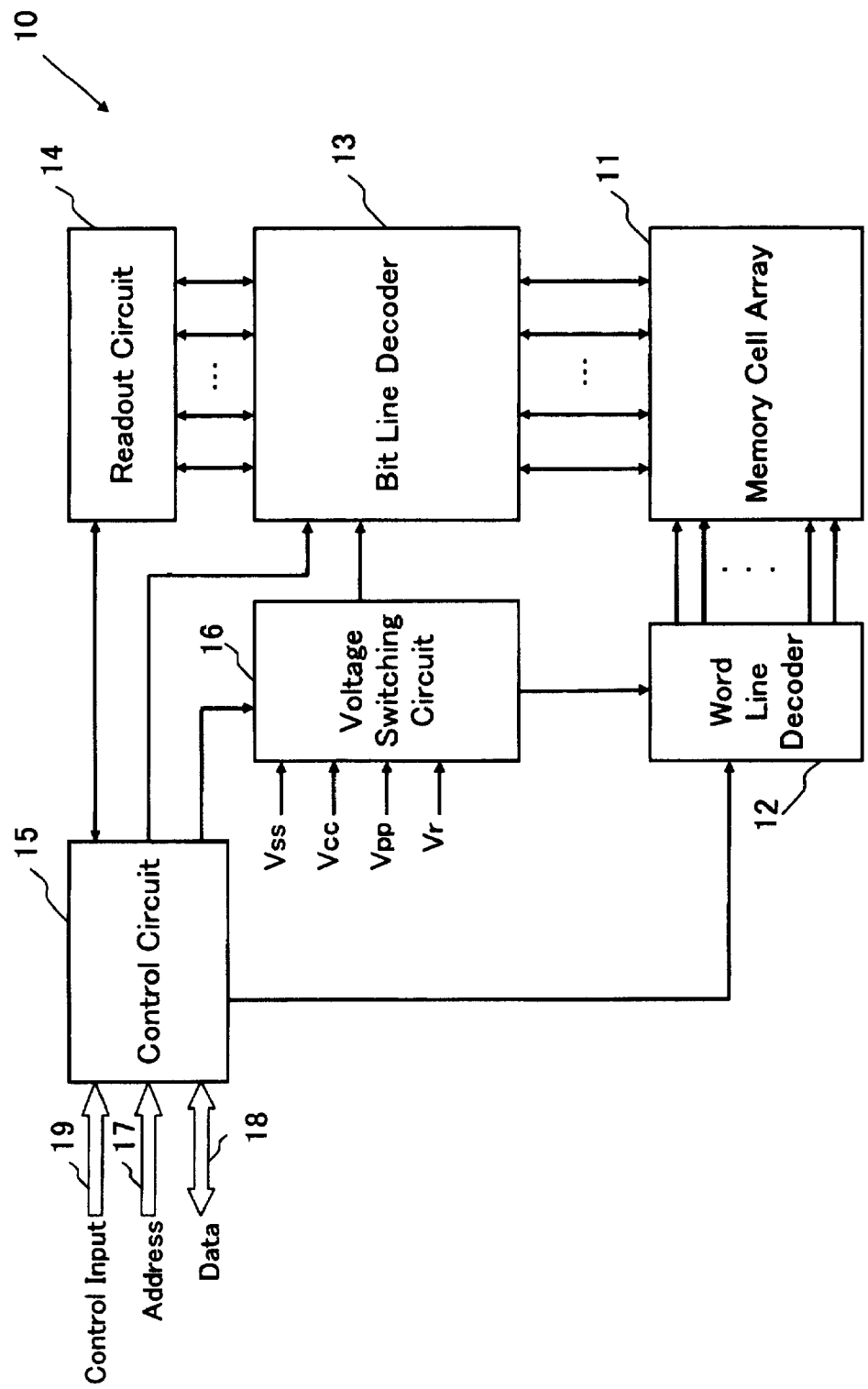
FIG. 24 is a block diagrams showing a schematic circuit constitution example of a nonvolatile semiconductor memory device according to one embodiment.

FIG. 24 shows a block diagram showing a device 10 according to one embodiment. As shown in FIG. 24, the device 10 of the present invention comprises a memory cell array 11, a word line decoder 12 (corresponding to a word line selecting circuit), a bit line decoder 13 (corresponding to a bit line selecting circuit), a readout circuit 14, a control circuit 15, and a voltage switching circuit 16.

The memory cell array 11 comprises nonvolatile memory cells arranged in rows and columns, in which information can be electrically programmed in the memory cell designated by an address inputted from the outside and the information stored in the memory cell designated by an address input can be read out. More specifically, information is stored in the specific memory cell in the memory cell array 11 specified by the address signal inputted from an address line 17. The information is outputted to an external device through a data line 18. Since specific memory cell array constitution and memory cell structure are the same as those described in the above first embodiment, the description for them is omitted.

The word line decoder 12 selects the word line in the memory cell array 11 corresponding to the row selecting address signal inputted to the address line 17, and applies a selected word line voltage and an unselected word line voltage corresponding to each memory operation of programming, erasing or reading, to a selected word line and an unselected word line, respectively. That is, at the time of writing operation (program or erase), it functions as a write voltage applying circuit to each word line.

In addition, when data is sequentially written in the plurality of memory cells in the memory cell array 11 along the word line or the bit line, the word line decoder 12 selects the word line or does not select the word line, according to the row address set based on the writing order determined by the control circuit 15 according to the method of the present invention described in the above first embodiment, regardless of the row selecting address signal inputted from the outside to the address line 17.

The bit line decoder 13 selects a bit line of the memory cell array 11 corresponding to the column selecting address signal inputted to the address line 17, and applies a selected bit line voltage and unselected bit line voltage corresponding to each memory operation of programming, erasing or reading, to the selected bit line and unselected bit line, respectively. That is, at the time of writing operation (program or erase), it functions as a write voltage applying circuit to each bit line.

In addition, when data is sequentially written in the plurality of memory cells in the memory cell array 11 along the word line or the bit line, the bit line decoder 13 selects the bit line or does not select the bit line, according to the column address set based on the writing order determined by the control circuit 15 according to the method of the present invention described in the above first embodiment regardless of the column selecting address signal inputted from the outside to the address line 17.

The control circuit 15 controls each memory operation such as program, erase and readout in the memory cell array 11. The control circuit 15 controls the reading, programming and erasing operations in the memory cell array 11 by controlling the word line decoder 12 and the bit line decoder 13, based on the address signal inputted from the address line 17, a data input inputted from a data line 18 (at the time of the programming operation or writing operation), and a control input signal inputted from a control signal line 19. According to the example shown in FIG. 24, the control circuit 15 comprises a general address buffer circuit, a data input/output buffer circuit, and a control input buffer circuit although they are not shown.

The control circuit 15 controls a sequential writing operation in the memory cell group connected to one word line according to the method as described in the above embodiment. More specifically, it controls the steps #1 to #4 of the flowchart shown in FIG. 13A.

When the expected value data is inputted at the step #1, the inputted expected value data is stored in a page buffer (corresponding to a buffer memory, not shown) temporally. When the sequential writing operation is performed for one word line, the capacity of the page buffer is for the one word line.

The writing order determined at the step #2 is determined according to the procedures shown in FIG. 13B. In confirming the contact position at the step #16, when the contact position is determined at the right end, left end or both ends in the constitution of the memory cell array 11, the determined contact position is used or when the contact position is changed every word line, the contact position is determined according to the row address for selecting the word line. For example, when the contact position of the even-numbered word line is at the right end and the contact position of the odd-numbered word line is at the left end, the contact position is confirmed with the lowest-order address of the row address.

After the contact position has been determined at the step #16, the writing order is determined by determining the selecting order of the bit line. More specifically, a shift sequence of the column address of the bit line is determined by the contact position and the distinction between the program and erase. More specifically, depending on the contact position and the distinction between the program and erase, it is determined 1) whether all of the column addresses are shifted and selected in ascending order of the address, 2) whether all of the column addresses are shifted and selected in descending order of the address, 3) whether the first half column addresses are shifted in ascending order of the address and the second half column addresses are shifted in descending order, and the first half column addresses and the second half column addresses are alternately selected, or 4) whether the first half column addresses are shifted in descending order of the address and the second half column addresses are shifted in ascending order of the address, and the first half column addresses and the second half column addresses are alternately selected.

When the programming operation is controlled at the step #3, the column address is controlled based on the determined shift sequence and the programming operations are sequentially executed in the program bits defined at the step #12 or #15.

When the erasing operation is controlled at the step #4, the column address is controlled based on the determined shift sequence and the erasing operations are sequentially executed in the erase bits defined at the step #12 or #15.

The voltage switching circuit 16 applies a selected word line voltage, an unselected word line voltage, a selected bit line voltage, and an unselected bit line voltage required for the reading, programming and erasing operations in the memory cell array 11, to the word line decoder 12 and the bit line decoder 13. Reference character Vcc designates a supply voltage (power supply voltage) of the device of the present invention, reference character Vss designates a ground voltage, reference character Vpp designates a program and erase voltage, and reference character Vr designates a read voltage.

The selected word line voltage, the unselected word line voltage, the selected bit line voltage, and the unselected bit line voltage for the programming and erasing operations are as described in the examples 1 and 3 of the first embodiment.

Data is read out from the memory cell array 11 through the bit line decoder 13 and the readout circuit 18. The readout circuit 18 determines a data state and sends its result to the control circuit 15, and the result is outputted to the data line 18.

At the time of reading operation, the readout voltage Vr, the ground voltage Vss and the readout voltage Vr are applied to all bit lines, the selected word line, and the unselected word line, respectively. Since a readout current corresponding to each memory cell on the selected word line flows in each bit line with respect to each word line, the readout current of the selected bit line can be selectively detected, so that the data in the selected memory cell can be read out. In addition, although the readout voltage Vr is applied to each memory cell on the selected word line, the readout voltage Vr (absolute value) is set to the middle voltage Vpp/2 (absolute value) or less so that unnecessary programming operation and the erasing operation are not performed.

Next, other embodiments of the device will be described.

(1) Although the description has been made on the assumption that the program and erase are sequentially performed in the plurality of memory cells connected to the same word line in the above embodiment, the method and device can be applied to a case where the program and erase are sequentially performed in the plurality of memory cells connected to the same bit line.

(2) Although it has been defined that the programming operation is performed when the resistance characteristics of the variable resistive element is shifted from the low resistance state to the high resistance state while the erasing operation is performed when the resistance characteristics of the variable resistive element is shifted from the high resistance state to the low resistance state in the above each embodiment, the definitions of the programming operation and the erasing operation may be exchanged.

(3) The voltage applying condition to the selected word line, the unselected word line, the selected bit line and the unselected bit line at the time of the programming, erasing described in the above embodiment is not limited to that of the above each embodiment. For example, the voltage applied to the selected word line and the voltage applied to the selected bit line may be exchanged.

Furthermore, although voltage applying condition to the selected word line, the unselected word line, the selected bit line and the unselected bit line at the time of the programming, erasing described in the above embodiment assumes a bipolar switching operation, a voltage applying condition assuming a monopolar switching operation may be used. Here, the bipolar switching operation means the resistance shifting operation in the case where the polarity of the voltage pulse applied to shift the resistance state of the variable resistive element from the high resistance state to the low resistance state and the polarity of the voltage pulse applied to shift the resistance state from the low resistance state to the high resistance state are different, and the monopolar switching operation means the resistance shifting operation in the case where both polarities of the voltage pulses are the same. In the bipolar switching operation, the program is distinguished from the erase with the polarity of the voltage pulse applied to the selected memory cell, and in the monopolar switching operation, the program is distinguished from the erase with the length of the applying time of the voltage pulse.

Figure 25B:
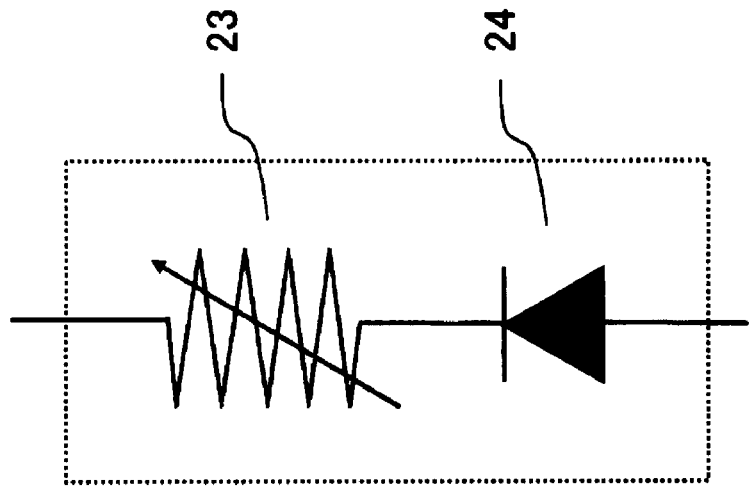
FIG. 25 is a vertical sectional view and an equivalent circuit diagram showing another example of the two-terminal structured memory cell in the cross-point type memory cell array shown in FIG. 1.
Figure 25A:
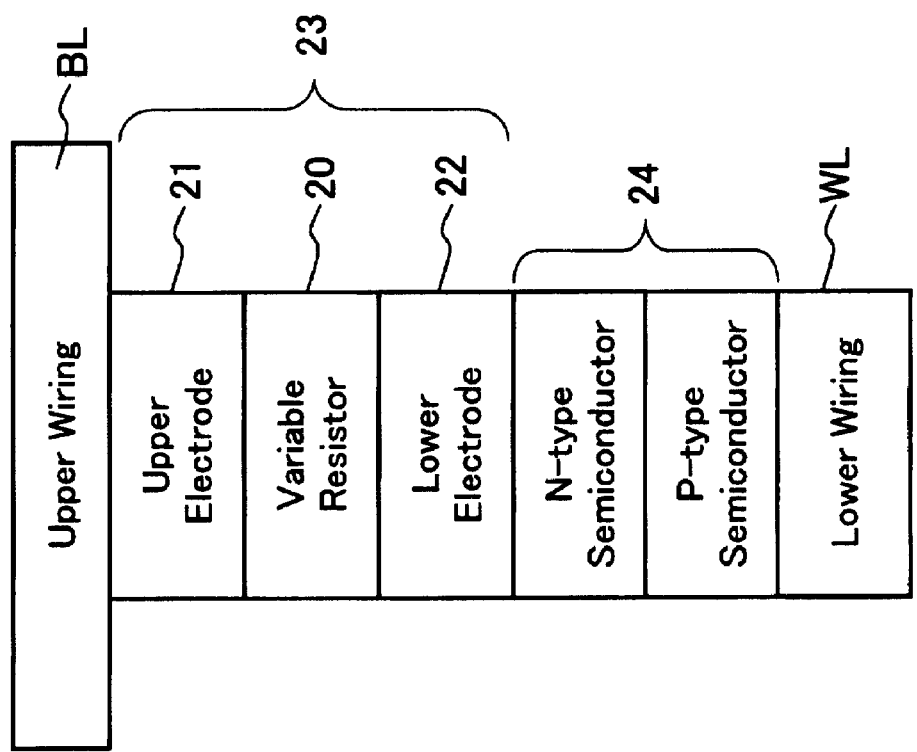

In addition, when the voltage applying condition assuming the monopolar switching operation is used, since the directions of the program current and the erase current flowing in the memory cell are the same, the direction of the memory cell current flowing in the memory cell may be limited to one direction. Thus, the influence of the leak current caused by the cross-point type memory cell array structure can be prevented. More specifically, the memory cell may have a two-terminal structure comprising a series circuit having a variable resistive element 23 in which a variable resistor 20 is sandwiched between two electrodes 21 and 22, and a diode 24 as shown in FIG. 25, other than the structure comprising only the three-layer resistive element shown in FIG. 2.

(4) Although data is programmed or erased every memory cell when the data is sequentially programmed or erased in the memory cells connected to the same word line in the above embodiment, that is, although data is programmed or erased in one memory cell at one time, the programming or erasing operation can be performed for the plurality of memory cells, for example, for two memory cells, at the same time. In this case, the memory cells to be written at the same time are selected according to the writing order determined by the method of the example embodiment.

(5) Although the resistance value of the variable resistive element of one memory cell is in the low resistance state or in the high resistance state, that is, two-level data is stored in each memory cell in the above embodiment, the variable resistive element may have three or more resistance values so as to store three or more multilevel data.

Figure 26:
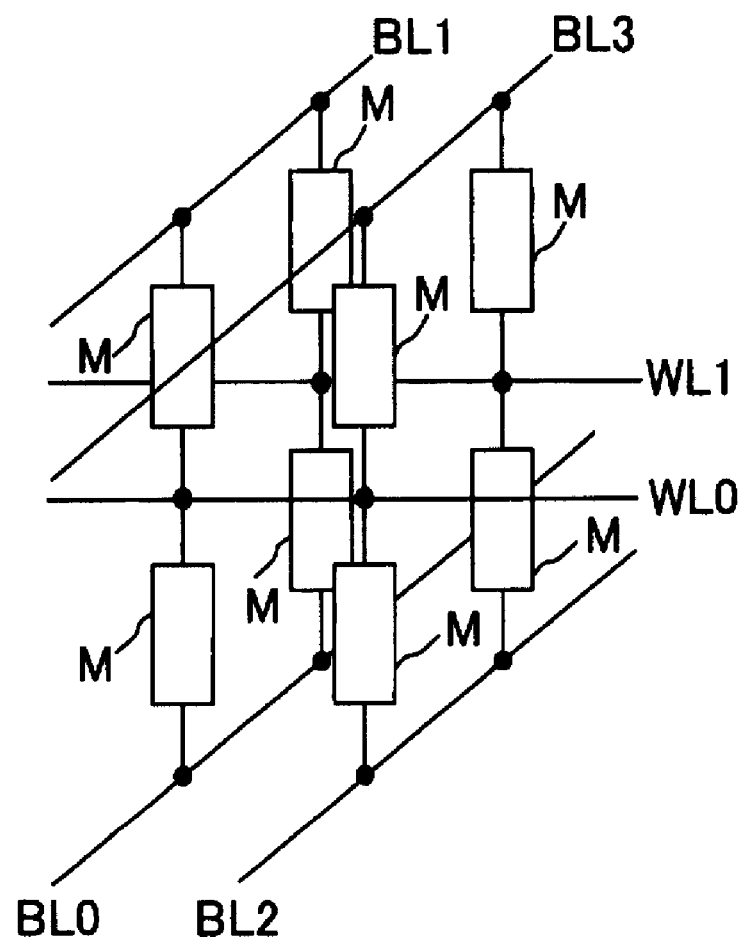
FIG. 26 is an equivalent circuit diagram schematically showing the partial constitution of a cross-point type memory cell array having a three-dimensional structure.

(6) Although the memory cell array 11 has the two-dimensional structure in which the memory cells are arranged in rows and columns in the above embodiment, it may have a three-dimensional structure in which the two-dimensional memory cell arrays are vertically stacked on a substrate as shown in FIG. 26.

The example embodiment presented herein can be advantageously applied to a nonvolatile semiconductor memory device comprising a cross-point type memory cell array in which memory cells each having two-terminal structure comprising a variable resistive element capable of storing data according to electric resistance change by the application of an electric stress are arranged in rows and columns.

Although the example embodiment presented herein has been described in terms of the preferred embodiment, it will be appreciated that various modifications and alternations might be made by those skilled in the art without departing from the spirit and scope of the example embodiment. The example embodiment should therefore be measured in terms of the claims which follow.

What is claimed is:

1. A method of writing data in a memory cell array, in which two-terminal structured memory cells each having a variable resistive element capable of storing data according to an electric resistance change by application of an electric stress are arranged in a row and column direction, a plurality of word lines extending in the row direction and a plurality of bit lines extending in the column direction are provided, the memory cells on a same row are connected at one end to a common word line, and the memory cells on a same column are connected at the other end to a common bit line, the method comprising:

writing data sequentially in a plurality of memory cells on a same row or a same column in the memory cell array based on a writing order of the plurality of memory cells to be written determined according to a memory cell wiring length and a number of memory cells in a high resistance state in all other memory cells other than the one memory cell to be written on a same wiring, wherein the memory cell wiring length is defined by length of the same wiring of a selected word line or a selected bit line which is connected to the memory cell to be written from an electric connection point between a write voltage applying circuit and the same wiring to the memory cell to be written, and the write voltage applying circuit applies a voltage for writing data to the selected word line or the selected bit line, wherein the connection point is on said wiring of a selected word line or a selected bit line, and wherein the writing order of the plurality of memory cells to be written which are same in the direction of change in the value of the electric resistance is determined such that the longer the memory cell wiring length of one memory cell to be written is, the larger a number of memory cells in a high resistance state in all of the memory cells than the one memory cell to be written on the same wiring is.

2. The method according to claim 1, wherein
a plurality of connection points exists on the same wiring, and the writing order of the plurality of memory cells to be written is determined using a shortest one of lengths from the plurality of the connection points to the memory cell to be written as the memory cell wiring length.

3. The method according to claim 1, wherein
the writing data is performed in a first memory cell group whose electric resistance is increased earlier than a second memory cell group whose electric resistance is decreased when the memory cell whose electric resistance is increased and the memory cell whose electric resistance is decreased by the writing data are mixed in the plurality of memory cells to be written.

4. The method according to claim 1, wherein
the writing data is sequentially performed from the memory cell of which the memory cell wiring length is shortest for a first memory cell group whose electric resistance is increased, and
the writing data is sequentially performed from the memory cell of which the memory cell wiring length is longest for a second memory cell group whose electric resistance is decreased
when the memory cell whose electric resistance is increased and the memory cell whose electric resistance is decreased by the writing data are mixed in the plurality of memory cells to be written.

5. The method according to claim 1, wherein
the writing data is sequentially performed from the memory cell of which the memory cell wiring length is shortest when the electric resistances of all the plurality of memory cells to be written are increased by the writing data.

6. The method according to claim 1, wherein
the writing data is sequentially performed from the memory cell of which the memory cell wiring length is longest when the electric resistances of all the plurality of memory cells to be written are decreased by the writing data.

7. The method according to claim 1 comprising:
comparing data of the plurality of memory cells to be written before writing with expected data after writing with respect to each memory cell;
judging whether memory cells whose electric resistance is increased and memory cells whose electric resistance is decreased by the writing data are mixed in the plurality of memory cells to be written; and when said memory cells whose electric resistance is increased and memory cells whose electric resistance is decreased by the writing data are mixed;
classifying the plurality of memory cells to be written into a first memory cell group whose electric resistance is increased and a second memory cell group whose electric resistance is decreased.

8. The method according to claim 1 comprising:
comparing data of the plurality of memory cells to be written before writing with expected data after writing with respect to each memory cell; and
judging the increase/decrease direction of the electric resistance of each memory cell changed by the writing data.

9. A nonvolatile semiconductor memory device comprising:
a memory cell array in which two-terminal structured memory cells each having a variable resistive element capable of storing data according to an electric resistance change by application of an electric stress are arranged in a row and column direction, a plurality of word lines extending in the row direction and a plurality of bit lines extending in the column direction are provided, the memory cells on a same row are connected at one end to a common word line, and the memory cells on a same column are connected at the other end to a common bit line;
a word line selecting circuit for selecting a predetermined number of the word lines from the plurality of word lines as selected word lines, and applying a selected word line voltage and an unselected word line voltage to the selected word lines and the unselected word lines, respectively;
a bit line selecting circuit for selecting a predetermined number of the bit lines from the plurality of bit lines as selected bit lines, and applying a selected bit line voltage and an unselected bit line voltage to the selected bit lines and the unselected bit lines, respectively; and a control circuit for controlling operations of the word line selecting circuit and the bit line selecting circuit, wherein
the control circuit determines a writing order of the plurality of memory cells to be written using the bit line selecting circuit as the write voltage applying circuit based on a writing order of the plurality of memory cells to be written determined according to a memory cell wiring length and a number of memory cells in a high resistance state in all other memory cells other than the one memory cell to be written on a same wiring, and controls selection of the bit line by the bit line selecting circuit based on the determined writing order when data is sequentially written in the plurality of memory cells on a same row in the memory cell array, wherein
the memory cell wiring length is defined by length of the same wiring of a selected word line or a selected bit line which is connected to the memory cell to be written from an electric connection point between a write voltage applying circuit and the same wiring to the memory cell to be written, and the write voltage applying circuit applies a voltage for writing data to the selected word line or the selected bit line, wherein the connection point is on said wiring of a selected word line or a selected bit line, wherein
the writing order of the plurality of memory cells to be written which are same in the direction of change in the value of the electric resistance is determined such that the longer the memory cell wiring length of one memory cell to be written is, the larger a number of memory cells in a higher resistance state in all other memory cells than the one memory cell to be written on the same wiring is.

10. A nonvolatile semiconductor memory device comprising:
a memory cell array in which two-terminal structured memory cells each having a variable resistive element capable of storing data according to an electric resistance change by application of an electric stress are arranged in a row and column direction, a plurality of word lines extending in the row direction and a plurality of bit lines extending in the column direction are provided, the memory cells on a same row are connected at one end to a common word line, and the memory cells on a same column are connected at the other end to a common bit line;

a word line selecting circuit for selecting a predetermined number of the word lines from the plurality of word lines as selected word lines, and applying a selected word line voltage and an unselected word line voltage to the selected word lines and the unselected word lines, respectively;

a bit line selecting circuit for selecting a predetermined number of the bit lines from the plurality of bit lines as selected bit lines, and applying a selected bit line voltage and an unselected bit line voltage to the selected bit lines and the unselected bit lines, respectively; and a control circuit for controlling operations of the word line selecting circuit and the bit line selecting circuit, wherein the control circuit determines a writing order of the plurality of memory cells to be written using the bit line selecting circuit as the write voltage applying circuit based on a writing order of the plurality of memory cells to be written determined according to a memory cell wiring length and a number of memory cells in a high resistance state in all other memory cells other than the one memory cell to be written on a same wiring, and controls selection of the bit line by the bit line selecting circuit based on the determined writing order when data is sequentially written in the plurality of memory cells on a same row in the memory cell array; and the control circuit determines a writing order of the plurality of memory cells to be written using the word line selecting circuit as the write voltage applying circuit according to said writing order of the plurality of memory cells, and controls selection of the word line by the word line selecting circuit based on the determined writing order when data is sequentially written in the plurality of memory cells on a same column in the memory cell array, wherein the memory cell wiring length is defined by length of the same wiring of a selected word line or a selected bit line which is connected to the memory cell to be written from an electric connection point between a write voltage applying circuit and the same wiring to the memory cell to be written, and the write voltage applying circuit applies a voltage for writing data to the selected word line or the selected bit line, wherein the connection point is on said wiring of a selected word line or a selected bit line, wherein the writing order of the plurality of memory cells to be written which are same in the direction of change in the value of the electric resistance is determined such that the longer the memory cell wiring length of one memory cell to be written is, the larger a number of memory cells in a high resistance state in all other memory cells than the one memory cell to be written on the same wiring is.

11. The nonvolatile semiconductor memory device according to claim 9 comprising:

a buffer memory for storing an expected data value before writing the plurality of memory cells to be written, wherein the control circuit reads data before writing the plurality of memory cells to be written, compares the expected data value stored in the buffer memory with the data before writing with respect to each memory cell, and judges whether memory cells whose electric resistance is increased and memory cells whose electric resistance is decreased by the writing data are mixed in the plurality of memory cells to be written or not.

12. The nonvolatile semiconductor memory device according to claim 9 comprising:

a buffer memory for storing an expected value before writing the plurality of memory cells to be written, wherein the control circuit reads data before writing the plurality of memory cells to be written, compares the expected data value stored in the buffer memory with the data before writing with respect to each memory cell, and judges the increase/decrease direction of the electric resistance of each memory cell changed by the writing data.

13. The nonvolatile semiconductor memory according to claim 9, wherein the variable resistive element is formed of a variable resistive material having transition metal oxide.

14. The nonvolatile semiconductor memory according to claim 9, wherein the variable resistive element is formed of a variable resistive material having transition metal oxide.

* * * * *